US012739994B2

(12) United States Patent
Kim

(10) Patent No.: US 12,739,994 B2
(45) Date of Patent: Sep. 15, 2026

(54) DOOR AND ENERGY STORAGE SYSTEM HAVING THE SAME

(71) Applicant: SAMSUNG SDI CO., LTD., Yongin-si (KR)

(72) Inventor: Soo Taek Kim, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 66 days.

(21) Appl. No.: 18/815,243

(22) Filed: Aug. 26, 2024

(65) Prior Publication Data

US 2025/0176127 A1 May 29, 2025

(30) Foreign Application Priority Data

Nov. 28, 2023 (KR) ........................ 10-2023-0167802

(51) Int. Cl.
*H05K 5/03* (2006.01)
*H05K 5/02* (2006.01)

(52) U.S. Cl.
CPC ............. *H05K 5/03* (2013.01); *H05K 5/0209* (2022.08)

(58) Field of Classification Search
CPC ............................................ H01M 50/35–367
See application file for complete search history.

(56) References Cited

U.S. PATENT DOCUMENTS

2024/0387940 A1* 11/2024 Harvey .................. A62C 2/065

* cited by examiner

*Primary Examiner* — Matthew W Ing
(74) *Attorney, Agent, or Firm* — Womble Bond Dickinson (US) LLP

(57) ABSTRACT

A door for an energy storage system includes: a first door frame; a second door frame facing the first door frame; a door channel between the first door frame and the second door frame; an inlet hole passing through the first door frame and configured to allow a flame or gas to be introduced into the door channel; a discharge hole passing through the second door frame and configured to allow a flame or gas to be discharged from the door channel; and a blocking member facing the discharge hole and configured to block a flame that is discharged from the discharge hole from passing therethrough.

20 Claims, 28 Drawing Sheets

DOOR AND ENERGY STORAGE SYSTEM HAVING THE SAME

CROSS-REFERENCE TO RELATED APPLICATION

The present application claims priority to and the benefit of Korean Patent Application No. 10-2023-0167802, filed on Nov. 28, 2023, in the Korean Intellectual Property Office, the entire disclosure of which is incorporated herein by reference.

BACKGROUND

1. Field

Aspects of embodiments of the present disclosure relate to a door and an energy storage system having the same.

2. Discussion of Related Art

Generally, an energy storage system (ESS) is a device that can store surplus electricity, for example, excess electricity produced by using renewable energy sources. An ESS may be configured by installing a plurality of battery modules in racks and accommodating the plurality of racks in a container. The battery modules may be constructed by assembling a plurality of secondary batteries, which are electrically connected to each other, in various structures.

The above-described information forms the background of the present disclosure and is intended to improve understanding of the background of the present disclosure. Therefore, it may include information that does not constitute the related (or prior) art.

SUMMARY

Embodiments of the present disclosure are provide a door configured to reduce damage caused by a flame when a battery ignites and an energy storage system having the same.

These and other aspects and features of the present disclosure will be described in, or will be apparent from, the following description of some embodiments of the present disclosure.

A door, according to an embodiment of the present disclosure, includes a first door frame, a second door frame facing the first door frame, a door channel between the first door frame and the second door frame, an inlet hole passing through the first door frame and configured to allow a flame or gas to be introduced into the door channel, a discharge hole passing through the second door frame and configured to allow a flame or gas to be discharged from the door channel, and a blocking member facing the discharge hole and configured to block a flame that is discharged from the discharge hole from passing therethrough.

The door channel may have a first inlet end portion and a second inlet end portion that are spaced apart from each other. The inlet hole may include a first inlet hole connected to the first inlet end portion, and a second inlet hole connected to the second inlet end portion.

The first inlet end portion and the second inlet end portion may be spaced apart from each other in a direction crossing a direction in which the inlet hole passes through the first door frame.

The first inlet end portion and the second inlet end portion may be spaced apart from each other in a direction parallel to the first door frame.

The first inlet hole may include a first upper inlet hole, a first lower inlet hole below the first upper inlet hole, and a first intermediate inlet hole between the first upper inlet hole and the first lower inlet hole.

The first upper inlet hole, the first lower inlet hole, and the first intermediate inlet hole may be separated from each other.

The second inlet hole may include a second upper inlet hole, a second lower inlet hole below the second upper inlet hole, and a second intermediate inlet hole between the second upper inlet hole and the second lower inlet hole.

The second upper inlet hole, the second lower inlet hole, and the second intermediate inlet hole may be separated from each other.

The discharge hole may be offset from the first inlet hole and the second inlet hole.

The discharge hole may be between the first inlet hole and the second inlet hole.

A ratio of an area of the inlet hole to an area of the discharge hole may be in a range between 50% and 80%.

The blocking member may include a blocking filter having a plurality of mesh holes and facing the discharge hole and a fixing bracket configured to fix the blocking filter to the second door frame.

The door may further include a canopy facing the blocking member and configured to guide discharge of gas that has passed through the blocking member.

The canopy may include a canopy body facing the blocking member and fixed to the second door frame, and a guide hole passing through the canopy and connected to the discharge hole.

The guide hole may face upwardly or downwardly.

The guide hole may be provided as a pair of guide holes, one of which may face upwardly and the other may face downwardly.

An energy storage system, according to another embodiment of the present disclosure, includes a cabinet, a plurality of battery modules inside the cabinet, and a door configured to open or close an internal space in the cabinet. The door includes a first door frame movably connected to the cabinet, a second door frame facing the first door frame, a door channel between the first door frame and the second door frame, an inlet hole passing through the first door frame and configured to allow a flame or gas to be introduced into the door channel, a discharge hole passing through the second door frame and configured to allow the flame or gas to be discharged from the door channel, and a blocking member facing the discharge hole and configured to block a flame that is discharged from the discharge hole from passing therethrough.

The door may face side surfaces of the battery modules.

The energy storage system may further include a first channel facing a vent of the battery module and may have a first end portion and a second end portion spaced apart from each other in a first direction, a guide member in the first channel and configured to guide a flame or gas discharged from the vent in the first direction, a second channel inside the cabinet and connected to the second end portion, and a discharge member connected to the second channel and configured to allow gas introduced into the second channel to be discharged outwardly from the cabinet.

The door may face the first end portion.

BRIEF DESCRIPTION OF THE DRAWINGS

The drawings attached to this specification illustrate some embodiments of the present disclosure and further describe aspects and features of the present disclosure together with the detailed description of the present disclosure. However, the present disclosure should not be construed as being limited to the embodiments shown in the drawings.

The above and other aspects and features of the present disclosure will become more apparent to those of ordinary skill in the art by describing embodiments thereof, in detail, with reference to the accompanying drawings, in which.

DETAILED DESCRIPTION

Figure 1:
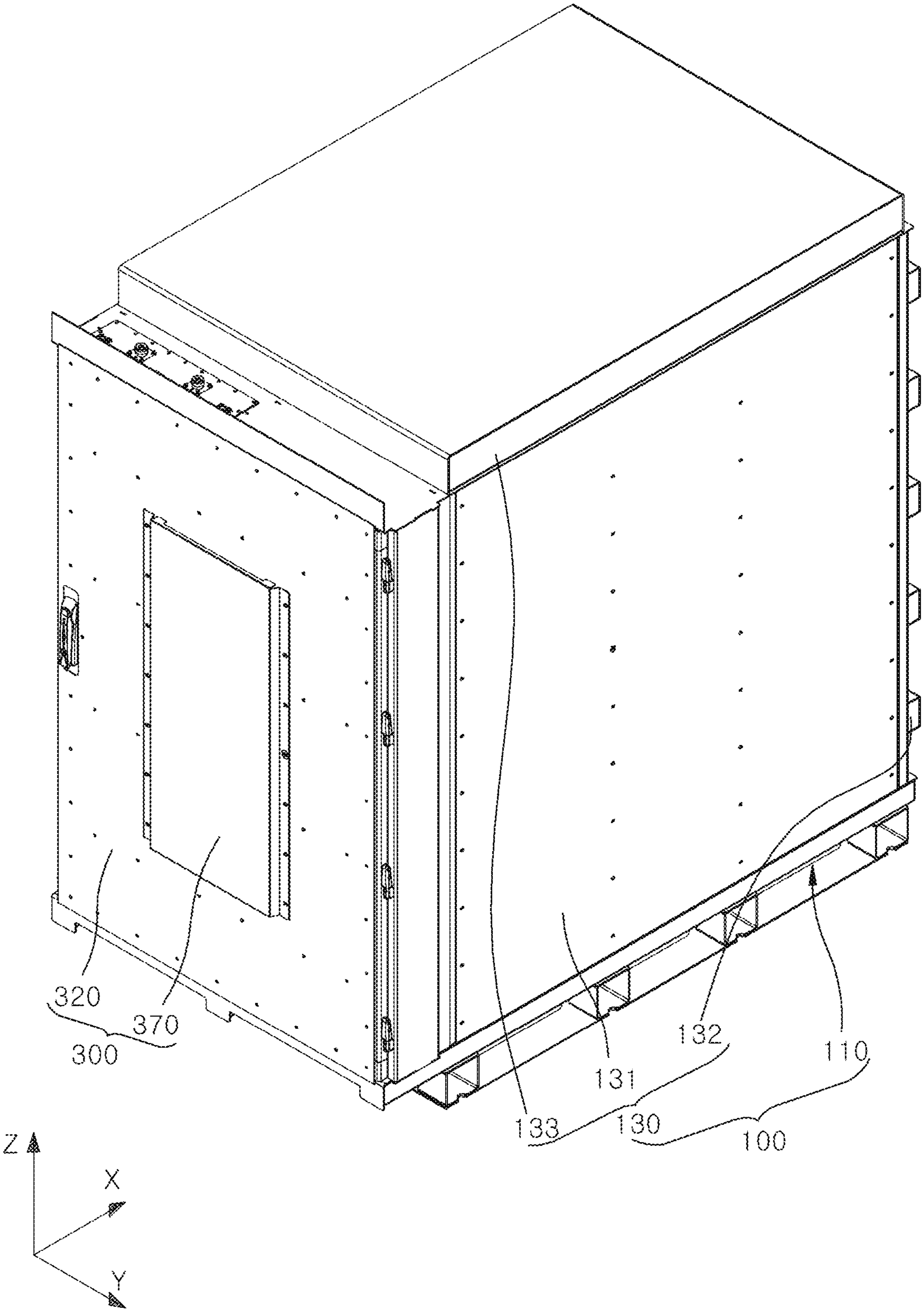
FIG. 1 is a perspective view schematically illustrating an energy storage system according to an embodiment of the present disclosure.

Herein, embodiments of the present disclosure will be described, in detail, with reference to the accompanying drawings. The terms or words used in this specification and claims should not be construed as being limited to the usual or dictionary meaning but should be interpreted as having meanings and concepts consistent with the technical idea of the present disclosure based on the principle that the inventor can be his/her own lexicographer to appropriately define the concept of a term.

The embodiments described in this specification and the configurations shown in the drawings are provided as some example embodiments of the present disclosure and do not represent all of the technical ideas, aspects, and features of the present disclosure. Accordingly, it is to be understood that there may be various equivalents and modifications that may replace or modify the embodiments described herein at the time of filing this application.

It is to be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same or like elements. As used herein, the term "and/or" includes any and all combinations of one or more of the associated listed items. Further, the use of "may" when describing embodiments of the present disclosure relates to "one or more embodiments of the present disclosure." Expressions, such as "at least one of" and "any one of," when preceding a list of elements, modify the entire list of elements and do not modify the individual elements of the list. When phrases such as "at least one of A, B, and C," "at least one of A, B, or C," "at least one selected from a group of A, B, and C," or "at least one selected from among A, B, and C" are used to designate a list of elements A, B, and C, the phrase may refer to any and all suitable combinations or a subset of A, B, and C, such as A, B, C, A and B, A and C, B and C, or A and B and C. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It is to be understood that, although the terms "first," "second," "third," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (e.g., rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It is to be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

References to two compared elements, features, etc. as being "the same" may mean that they are "substantially the same." Thus, the phrase "substantially the same" may include a case having a deviation that is considered low in the art, for example, a deviation of 5% or less. In addition, when a certain parameter is referred to as being uniform in a given region, it may mean that it is uniform in terms of an average.

Throughout the specification, unless otherwise stated, each element may be singular or plural.

When an arbitrary element is referred to as being arranged (or located or positioned) on the "above (or below)" or "on (or under)" a component, it may mean that the arbitrary element is placed in contact with the upper (or lower) surface of the component and may also mean that another component may be interposed between the component and any arbitrary element arranged (or located or positioned) on (or under) the component.

In addition, it is to be understood that when an element is referred to as being "coupled," "linked," or "connected" to another element, the elements may be directly "coupled," "linked," or "connected" to each other, or one or more intervening elements may be present therebetween, through which the element may be "coupled," "linked," or "connected" to another element. In addition, when a part is referred to as being "electrically coupled" to another part, the part may be directly electrically connected to another part or one or more intervening parts may be present therebetween such that the part and the another part are indirectly electrically connected to each other.

Throughout the specification, when "A and/or B" is stated, it means A, B, or A and B, unless otherwise stated. That is, "and/or" includes any or all combinations of a plurality of items enumerated. When "C to D" is stated, it means C or more and D or less, unless otherwise specified.

The terms used in the present specification are for describing embodiments of the present disclosure and are not intended to limit the present disclosure.

Figure 2:
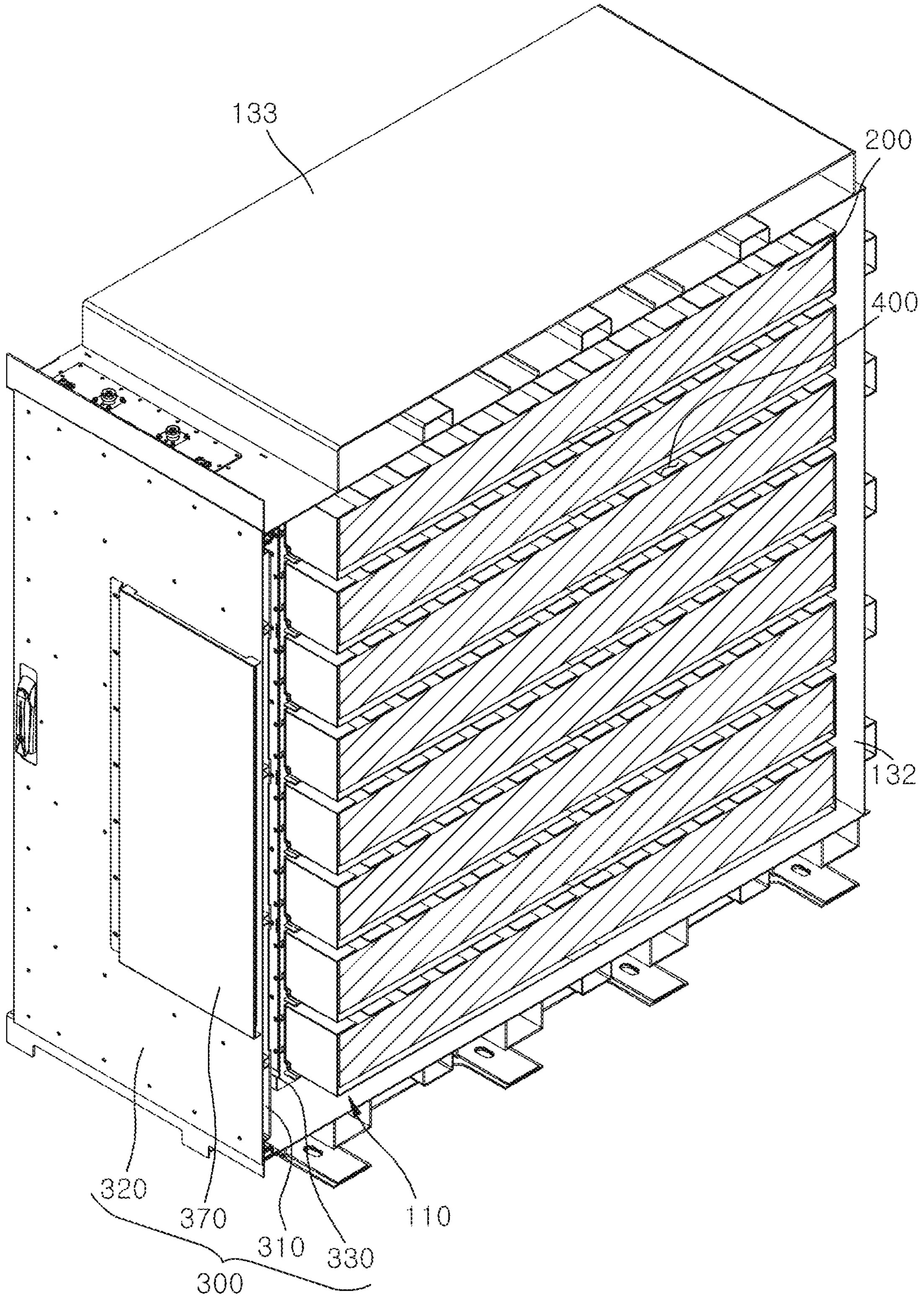
FIG. 2 is a cross-sectional perspective view schematically of the energy storage system shown in FIG. 1.
Figure 3:
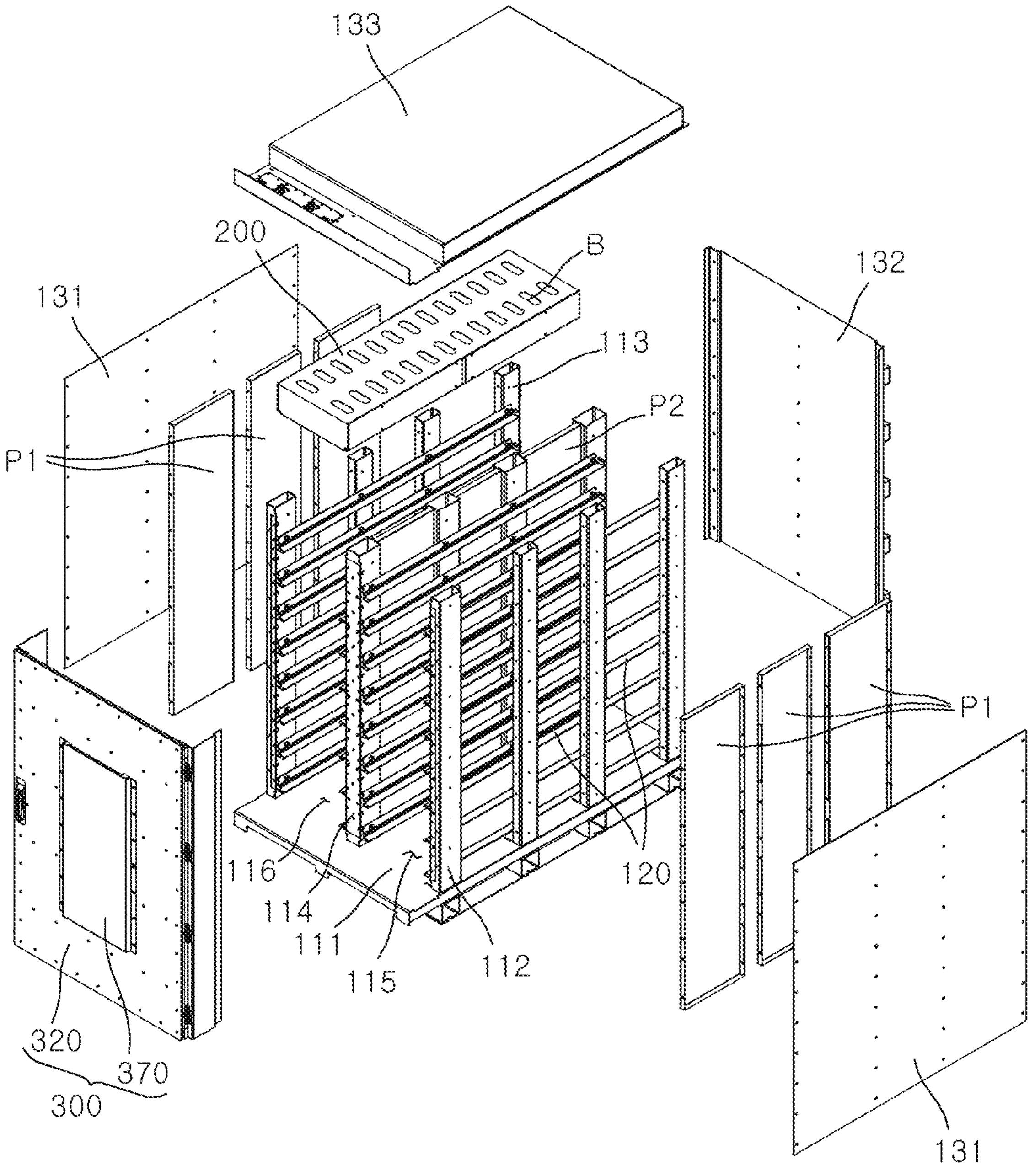
FIG. 3 is an exploded perspective view schematically illustrating the energy storage system shown in FIGS. 1 and 2.

FIG. 1 is a perspective view schematically illustrating an energy storage system according to an embodiment of the present disclosure, FIG. 2 is a cross-sectional perspective view schematically illustrating the energy storage system shown in FIG. 1, and FIG. 3 is an exploded perspective view schematically illustrating the energy storage system shown in FIGS. 1 and 2.

Referring to FIGS. 1 to 3, the energy storage system according to the illustrated embodiment includes a cabinet 100, a battery module 200, and a door 300.

The cabinet 100 may form an outer appearance of the energy storage system. Examples of the cabinet 100 may include various types of closed structures having an empty interior, such as a container and the like.

A longitudinal direction of the cabinet 100, to be described below, may be a direction parallel to an X-axis in FIG. 1, a width direction of the cabinet 100 may be a direction parallel to a Y-axis in FIG. 1, and a height direction of the cabinet 100 may be a direction parallel to a Z-axis in FIG. 1. The height direction of the cabinet 100 may be a direction perpendicular to the ground, that is, a direction parallel to a vertical direction.

The cabinet 100 may include a frame body 110, a support rail 120, and a cover 130.

The frame body 110 may form a framework of the cabinet 100 and entirely support a side cover 131, an end cover 132, and a top cover 133.

The frame body 110 may include a base 111, a first outer frame 112, a second outer frame 113, and an inner frame 114.

The base 111 may be seated (or placed) on the ground (e.g., the base 111 may be supported by the ground). An upper surface of the base 111 may have a flat plate shape.

The first outer frame 112 may have a pillar shape extending upwardly from the upper surface of the base 111. The first outer frame 112 may be provided as a plurality of first outer frames 112. The first outer frames 112 may be arranged to be spaced apart from each other at an interval (e.g., at a set interval) in the longitudinal direction of the cabinet 100. The number of first outer frames 112 and the interval between the first outer frames 112 may be varied depending on the size or the like of the base 111.

The second outer frame 113 may have a pillar shape extending upwardly from the upper surface of the base 111. The second outer frame 113 may be provided to be spaced apart from the first outer frame 112 in the width direction of the cabinet 100. For example, as illustrated in FIG. 3, the first outer frame 112 and the second outer frame 113 may be disposed at both end portions (e.g., opposite end portions) of the base 111 in the width direction. The second outer frame 113 may be provided as a plurality of second outer frames 113. The second outer frames 113 may be arranged to be spaced apart from each other at an interval (e.g., at a set interval) in the longitudinal direction of the cabinet 100. The number of second outer frames 113 and the interval between the second outer frames 113 may be the same as those of the first outer frames 112.

The inner frame 114 may have a pillar shape extending upwardly from the upper surface of the base 111. The inner frame 114 may be disposed between the first outer frame 112 and the second outer frame 113. The inner frame 114 may be provided as a plurality of inner frames 114. The inner frames 114 may be arranged to be spaced apart from each other at an interval (e.g., at a set interval) in the longitudinal direction of the cabinet 100. The number of the inner frames 114 and the interval between the inner frames 114 may be the same as those of the first outer frame 112.

The frame body 110 may form a first accommodation space 115 between the first outer frame 112 and the inner frame 114 and a second accommodation space 116 between the second outer frame 113 and the inner frame 114.

The support rail 120 may be disposed inside the frame body 110 and may support the battery module 200 inside the frame body 110. The support rail 120 may have a bar shape having a longitudinal direction extending in the longitudinal direction of the cabinet 100. The support rail 120 may have a substantially "L"-shaped cross section. The support rail 120 may be provided as a plurality of support rails 120. All of the support rails 120 may be installed in the first accommodation space 115 and the second accommodation space 116.

The plurality of support rails 120 disposed inside the first accommodation space 115 may be arranged in two rows in a width direction of the first accommodation space 115. The support rails 120 arranged in different rows may be disposed to face each other inside the first accommodation space 115. One surface of each of the support rails 120 arranged in any one row may be fixed to the first outer frame 112 inside the first accommodation space 115. One surface of each of the support rails 120 arranged in the other row may be fixed to the inner frame 114 inside the first accommodation space 115. The plurality of support rails 120 disposed inside the first accommodation space 115 may be stacked in a height direction of the first accommodation space 115, that is, at an interval (e.g., at a set interval) in the vertical direction.

The plurality of support rails 120 disposed inside the second accommodation space 116 may be arranged in two rows in a width direction of the second accommodation space 116. The support rails 120 arranged in different rows may be disposed to face each other inside the second accommodation space 116. One surface of each of the support rails 120 arranged in any one row may be fixed to the second outer frame 113 inside the second accommodation space 116. One surface of each of the support rails 120 arranged in the other row may be fixed to the inner frame 114 inside the second accommodation space 116. The plurality of support rails 120 disposed inside the second accommodation space 116 may be stacked in a height direction of the second accommodation space 116, that is, at an interval (e.g., at a set interval) in the vertical direction.

The cover 130 may be disposed to surround outer surfaces of the frame body 110.

The cover 130 may include the side cover 131, the end cover 132, and the top cover 133.

The side cover 131 may be disposed to surround (e.g., to cover) side surfaces of the frame body 110. In the illustrated embodiment, the side surfaces of the frame body 110 may be surfaces parallel to the longitudinal direction of the cabinet 100 from among all circumferential surfaces of the frame body 110. The side cover 131 may have a substantially flat plate shape.

The side cover 131 may be provided as a pair of side covers 131. The pair of side covers 131 may be disposed to be spaced apart from each other in the width direction of the cabinet 100. The pair of side covers 131 may be disposed to surround (e.g., to cover) both side surfaces of the frame body 110. For example, an inner surface of any one of the pair of side covers 131 may be disposed to face an outer surface of the first outer frame 112. An inner surface of the other of the pair of side covers 131 may be disposed to face an outer surface of the second outer frame 113. The side covers 131 may be fixed to the base 111 by welding, bolting, etc.

The end cover 132 may be disposed to surround (e.g., cover) a rear surface of the frame body 110. In the illustrated embodiment, the rear surface of the frame body 110 may be any one surface from among the circumferential surfaces of the frame body 110 parallel to the width direction of the cabinet 100. The end cover 132 may have a substantially flat plate shape. An inner surface of the end cover 132 may be disposed to face the first outer frame 112, the second outer frame 113, and the inner frame 114, which are disposed at the rearmost end from among the plurality of first outer frames 112, the plurality of second outer frames 113, and the plurality of inner frames 114. The end cover 132 may be fixed to the base 111 by welding, bolting, etc.

The top cover 133 may be disposed to surround (e.g., to cover) an upper surface of the frame body 110. The top cover 133 may have a substantially flat plate shape. An inner surface of the top cover 133 may be disposed to face upper end portions of the plurality of first outer frames 112, upper end portions of the plurality of second outer frames 113, and upper end portions of the plurality of inner frames 114. The end cover 132 may be fixed to the upper end portions of the first outer frames 112, the upper end portions of the second outer frames 113, and the upper end portions of the inner frames 114 by welding, bolting, etc.

A first direction, to be described below, may be a direction from a front surface of the frame body 110 toward the end cover 132 from among directions parallel to the longitudinal direction of the cabinet 100, and a second direction may be any one direction crossing the first direction from among directions parallel to the width direction of the cabinet 100.

The battery module 200 may be a unit structure that stores and supplies power in (e.g., as part of) an energy storage system. The battery module 200 may include a module case and a plurality of battery cells accommodated inside the module case. The battery cells may prismatic, cylindrical, or pouch-type secondary batteries in which an electrode assembly including a positive electrode plate and a negative electrode plate that are placed at both sides (e.g., opposite sides) of a separator is disposed inside a cell case and which is configured to charge and discharge an amount of power (e.g., a preset amount of power). The battery module 200 may have a substantially rectangular parallelepiped box shape.

The battery module 200 may be provided as a plurality of battery modules 200. The plurality of battery modules 200 may be arranged in at least two rows in the second direction, that is, a direction parallel to the width direction of the cabinet 100. For example, the plurality of battery modules 200 may be arranged in two rows in the second direction, and the plurality of battery modules 200 arranged in different rows may be disposed inside the first accommodation space 115 and the second accommodation space 116. The plurality of battery modules 200 may be stacked in the vertical direction inside the first accommodation space 115 and the second accommodation space 116.

The battery module 200 may be seated on the support rails 120 and supported by the support rails 120. For example, a lower surface of the battery module 200 may be in contact with a pair of support rails 120 disposed to face each other in the width direction of the cabinet 100 inside the first accommodation space 115 or the second accommodation space 116.

A distance between a pair of battery modules 200 disposed vertically adjacent to each other inside the first accommodation space 115 or the second accommodation space 116 may be greater than a height of any one battery module 200. That is, the height of the battery module 200 may be smaller than an interval between the pair of support rails 120 disposed vertically adjacent to each other inside the first accommodation space 115 or the second accommodation space 116.

A vent B may be formed in an upper surface of the battery module 200 to discharge, from the battery module 200, a flame or gas generated when a battery cell accommodated inside the battery module 200 ignites or experiences thermal runaway. The vent B may be provided as a plurality of vents B. The plurality of vents B may be arranged in at least two rows in the longitudinal and width directions of the battery module 200.

A communication device for communication with external devices and a control device for controlling power transmission may be installed on a front surface of the battery module 200 located on an opposite side of the end cover 132.

The door 300 may be installed to be movable relative to the frame body 110 and to open and close an internal space of the cabinet 100 depending on the direction of movement. The door 300 may be disposed to face a side surface of the battery module 200, for example, the front surface of the battery module 200.

Figure 4:
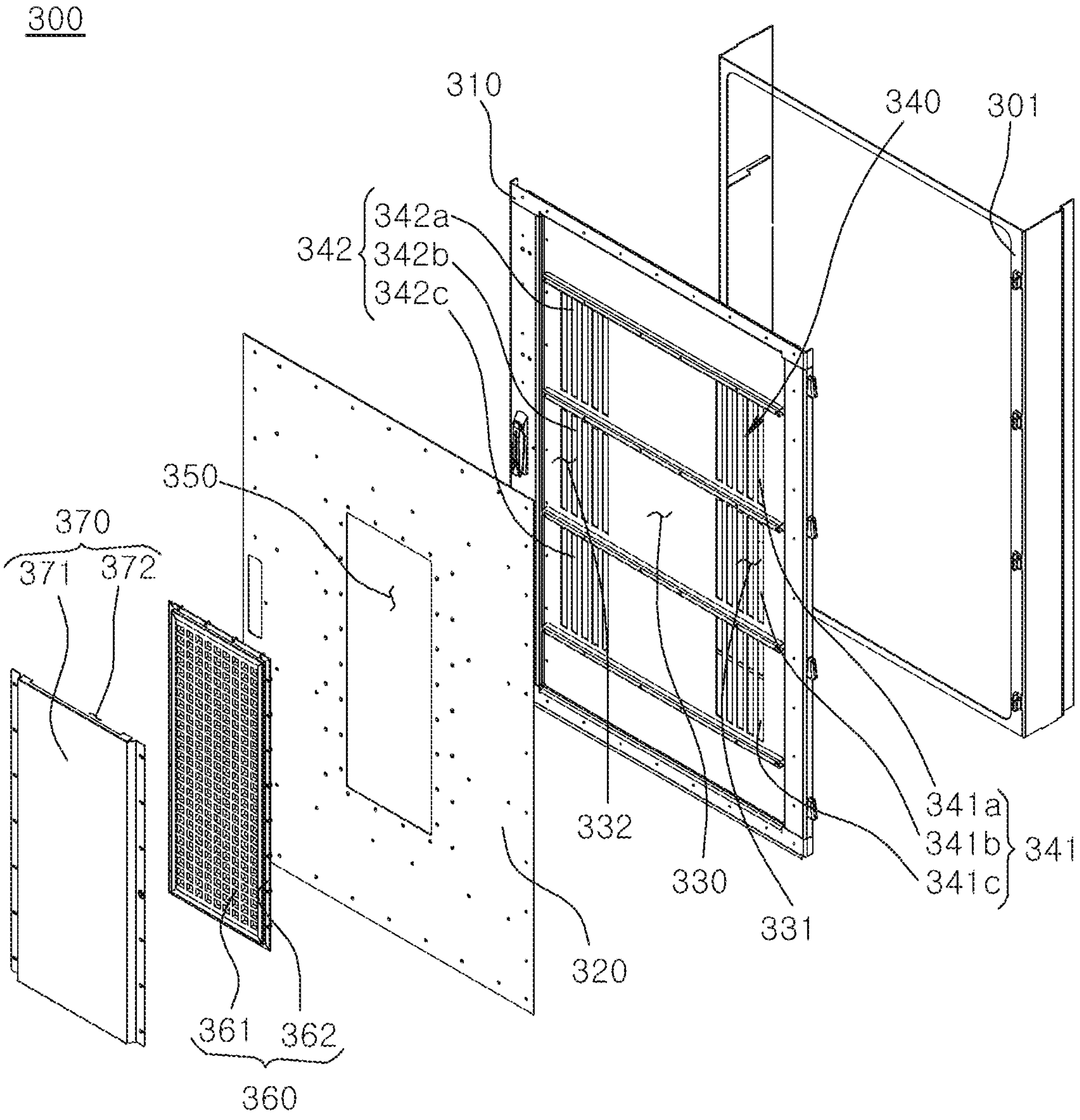
FIG. 4 is an exploded perspective view schematically illustrating a door of the energy storage system shown in FIGS. 1-3.
Figure 5:
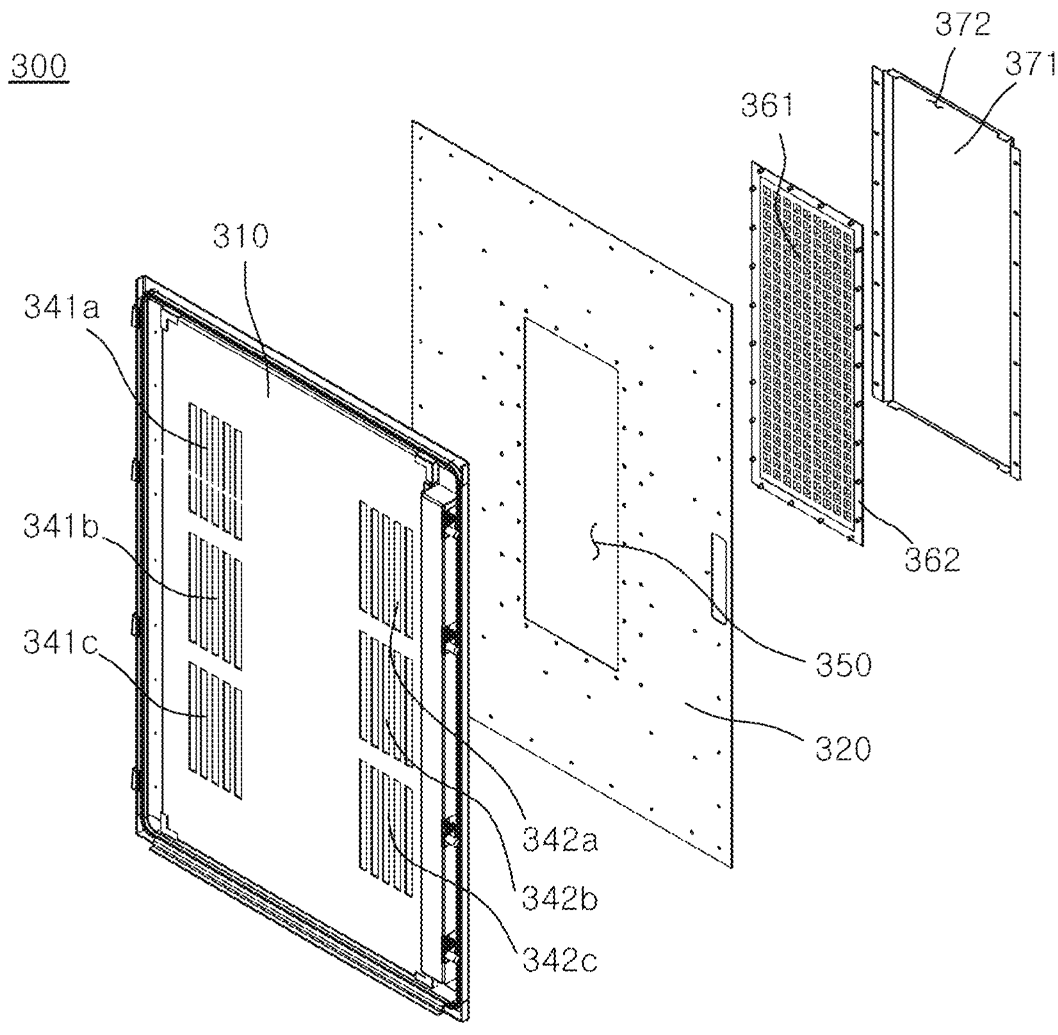
FIG. 5 is an exploded perspective view of the door shown in FIG. 4.
Figure 6:
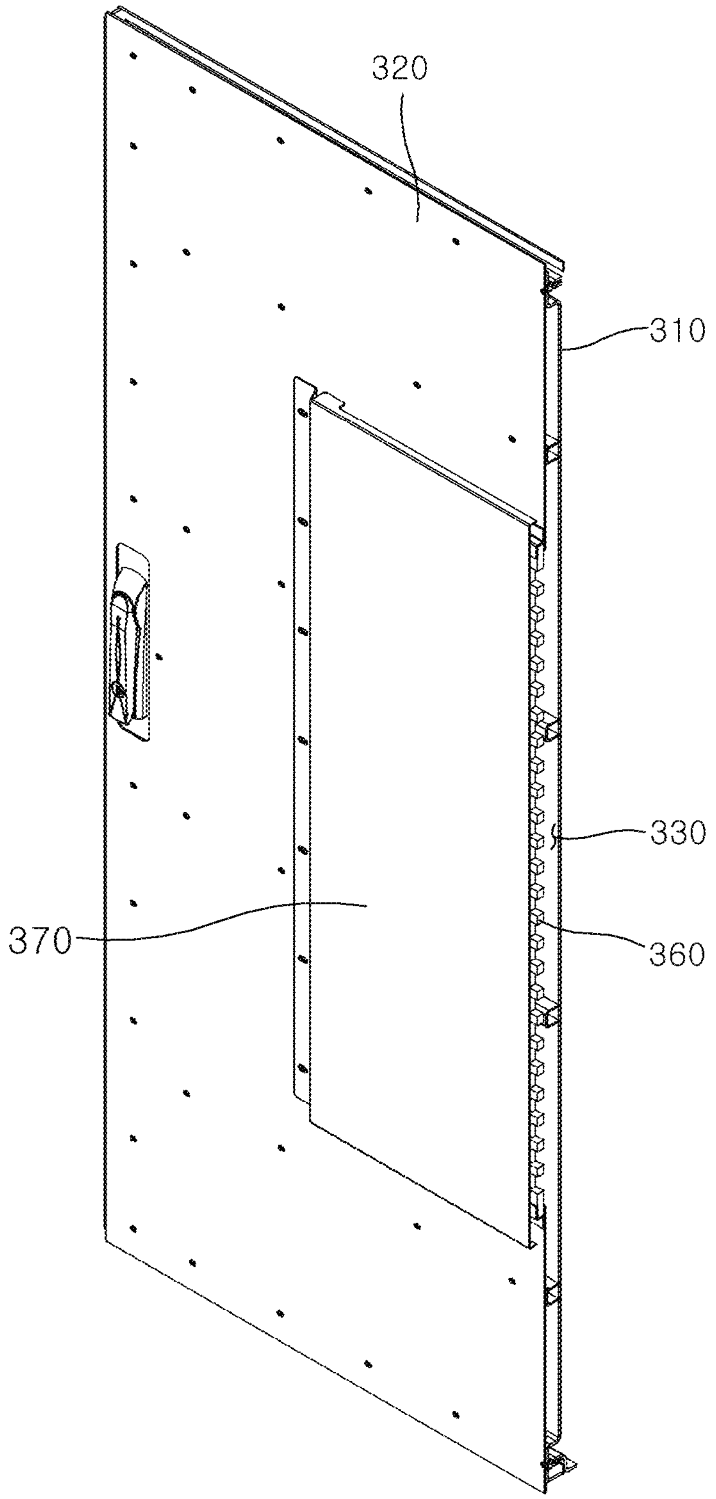
FIG. 6 is a side cross-sectional view of the door shown in FIGS. 4 and 5.
Figure 7:
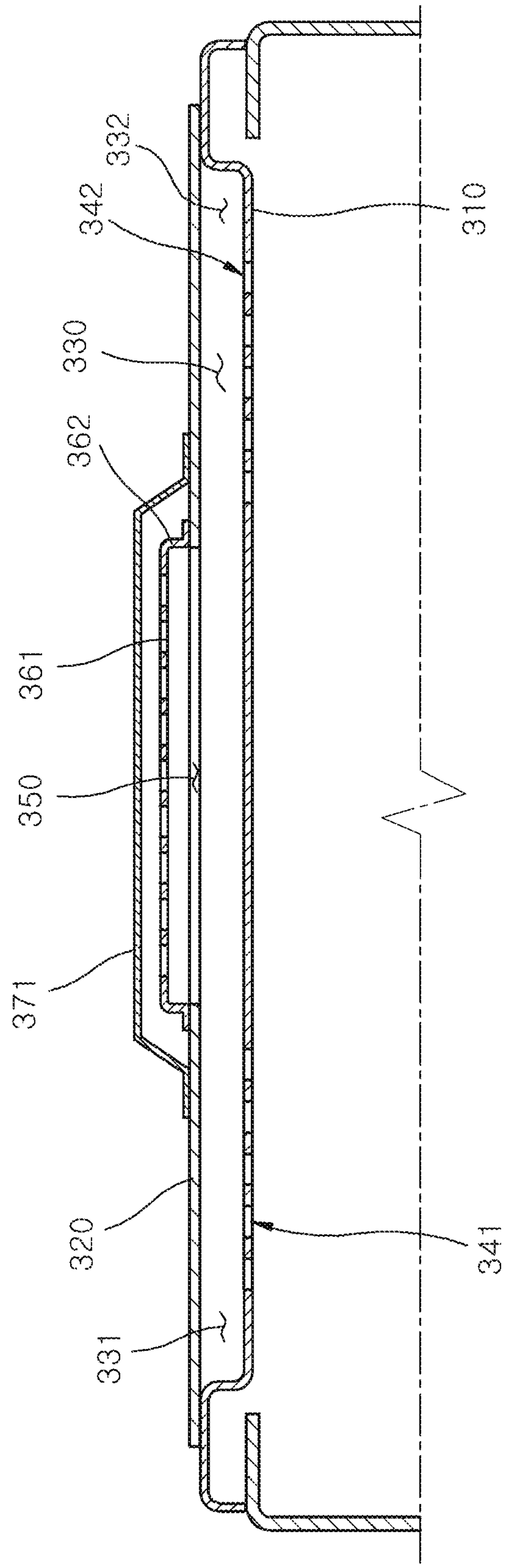
FIG. 7 is a top cross-sectional view of the door shown in FIGS. 4-6.

FIG. 4 is an exploded perspective view schematically illustrating the door shown in FIGS. 1-3, FIG. 5 is an exploded perspective view illustrating the door shown in FIG. 4 from a different viewpoint, FIG. 6 is a side cross-sectional view illustrating the door shown in FIG. 4 from a different viewpoint, and FIG. 7 is a top cross-sectional view illustrating the door shown in FIG. 4.

Referring to FIGS. 4 to 7, the door 300 may include a first door frame 310, a second door frame 320, a door channel 330, an inlet hole (e.g., an inlet opening) 340, a discharge hole (e.g., a discharge opening) 350, and a blocking member 360.

The first door frame 310 may form an appearance of an inner side (e.g., may form an inner facing surface) of the door 300. The first door frame 310 may have a plate shape with a concavely recessed central portion. The first door frame 310 may be disposed to surround (e.g., to cover) the front surface of the frame body 110. In the illustrated embodiment, the front surface of the frame body 110 may be one remaining surface located on an opposite side of the end cover 132 from among the circumferential surfaces of the frame body 110 parallel to the width direction of the cabinet 100. The concave surface of the first door frame 310 may be disposed to face the outside of the frame body 110.

The first door frame 310 may be rotatably (e.g., pivotably) installed on the front surface of the frame body 110. For example, one side of the first door frame 310 may be rotatably connected to a door bracket 301 installed on a front portion of the frame body 110 by a pin, hinge, etc. One side of the first door frame 310 may be rotatably supported about an axis in the height direction of the cabinet 100, that is, the vertical direction. The first door frame 310 may rotate clockwise or counterclockwise about one side thereof to open and close an internal space of the frame body 110.

When the first door frame 310 closes the internal space of the frame body 110, a width direction of the first door frame 310 may be parallel to the width direction of the cabinet 100 (e.g., the second direction). A thickness direction of the first door frame 310 may be parallel to the longitudinal direction of the cabinet 100 (e.g., the first direction).

The second door frame 320 may form an outer appearance of an outer side of the door 300. The second door frame 320 may have a substantially flat plate shape. The second door frame 320 may be disposed to face the first door frame 310 outside the first door frame 310. For example, an inner surface of the second door frame 320 may be disposed to face an outer surface of the first door frame 310, that is, the concavely recessed surface of the first door frame 310. The inner surface of the second door frame 320 may be fixed to the outer surface of the first door frame 310 by welding, bolting, etc.

The door channel 330 may be disposed between the first door frame 310 and the second door frame 320. Examples of the door channel 330 may include an empty space formed between the first door frame 310 and the second door frame 320 because (e.g., to accommodate) the central portion of the outer surface of the first door frame 310 that is concavely recessed.

The door channel 330 may include a first inlet end portion 331 and a second inlet end portion 332 that are spaced apart from each other.

The first inlet end portion 331 and the second inlet end portion 332 may be spaced apart from each other in a direction parallel to the first door frame 310 inside the door channel 330. For example, the first inlet end portion 331 and the second inlet end portion 332 may be spaced apart from each other in a direction that is parallel to the width direction of the first door frame 310 and crosses the thickness direction of the first door frame 310. A distance between the first inlet end portion 331 and the second inlet end portion 332 may be smaller than the widths of the first door frame 310 and the second door frame 320.

A gasket may be installed between the first door frame 310 and the second door frame 320. The gasket may be made of an elastically deformable material, such as rubber, silicone, etc. The gasket may have a band shape with an open central portion and may be disposed to surround (e.g., to extend around a periphery of) the door channel 330. Each of both surfaces of the gasket may be in close contact with one of the outer surface of the first door frame 310 and an outer surface of the second door frame 320. Accordingly, the gasket may prevent a flame or smoke introduced into the door channel 330 from being discharged to the outside through a gap between the first door frame 310 and the second door frame 320.

The inlet hole 340 may have be a hole (e.g., an opening) that passes through the first door frame 310 in the thickness direction of the first door frame 310 and has a vertically extended shape. The inlet hole 340 may allow the flame or gas to be introduced into the door channel 330 when a fire occurs inside the cabinet 100.

The inlet hole 340 may include a first inlet hole 341 and a second inlet hole 342.

The first inlet hole 341 may be formed in one side of the first door frame 310 and may be connected to the first inlet end portion 331. The first inlet hole 341 may allow the flame or gas generated inside the cabinet 100 to be introduced into the first inlet end portion 331 of the door channel 330. The first inlet hole 341 may pass through the first door frame 310 in a direction crossing the direction in which the first inlet end portion 331 and the second inlet end portion 332 are spaced apart from each other. Accordingly, a movement direction of the flame or gas introduced into the first inlet hole 341 may be changed by the door channel 330 and a movement speed thereof may be reduced.

The first inlet hole 341 may include a first upper inlet hole 341*a*, a first intermediate inlet hole 341*b*, and a first lower inlet hole 341*c*.

The first upper inlet hole 341*a*, the first intermediate inlet hole 341*b*, and the first lower inlet hole 341*c* may be sequentially arranged downwardly from the top of the first door frame 310. Accordingly, the first inlet hole 341 may allow the flame or gas discharged from the battery modules 200 stacked in the vertical direction to be introduced into the door channel 330 along the shortest path regardless of the discharge location.

The first upper inlet hole 341*a*, the first intermediate inlet hole 341*b*, and the first lower inlet hole 341*c* may be separated from each other. For example, end portions of the first upper inlet hole 341*a*, the first intermediate inlet hole 341*b*, and the first lower inlet hole 341*c* may be disposed to be spaced a apart from each other by an interval (e.g., a predetermined interval) in the vertical direction. Accordingly, the first inlet hole 341 can prevent foreign substances from accumulating in the first lower inlet hole 341*c* when the flame or gas discharged from the battery module 200 passes through the first upper inlet hole 341*a*, the first intermediate inlet hole 341*b*, and the first lower inlet hole 341*c*.

The first upper inlet hole 341*a*, the first intermediate inlet hole 341*b*, and the first lower inlet hole 341*c* may be respectively provided as a plurality of first upper inlet holes 341*a*, a plurality of first intermediate inlet holes 341*b*, and a plurality of first lower inlet holes 341*c*. The plurality of first upper inlet holes 341*a*, the plurality of first intermediate inlet holes 341*b*, and the plurality of first lower inlet holes 341*c* may be arranged in parallel in the width direction of the first door frame 310.

The cross-sectional shapes of the first upper inlet hole 341*a*, the first intermediate inlet hole 341*b*, and the first lower inlet hole 341*c* may have various shapes, such as a circular shape, a polygonal shape, and the like in addition to an elliptical shape illustrated in FIGS. 4 and 5.

The second inlet hole 342 may be formed in the other side of the first door frame 310 and may be connected to the second inlet end portion 332. The second inlet hole 342 may be spaced apart from the first inlet hole 341 in the width direction of the first door frame 310. The second inlet hole 342 may allow the flame or gas generated inside the cabinet 100 to be introduced into the second inlet end portion 332 of the door channel 330. The second inlet hole 342 may pass through the first door frame 310 in a direction crossing the direction in which the first inlet end portion 331 and the second inlet end portion 332 may be spaced apart from each other. Accordingly, the movement direction of the flame or gas introduced into the second inlet hole 342 may be changed by the door channel 330 and the movement speed thereof may be reduced.

The second inlet hole 342 may include a second upper inlet hole 342*a*, a second intermediate inlet hole 342*b*, and a second lower inlet hole 342*c*.

The second upper inlet hole 342*a*, the second intermediate inlet hole 342*b*, and the second lower inlet hole 342*c* may be sequentially arranged downwardly from the top of the first door frame 310. Accordingly, the second inlet hole 342 may allow the flame or gas discharged from the battery modules 200 stacked in the vertical direction to be introduced into the door channel 330 along the shortest path regardless of the discharge location.

The second upper inlet hole 342*a*, the second intermediate inlet hole 342*b*, and the second lower inlet hole 342*c* may be separated from each other. For example, end portions of the second upper inlet hole 342*a*, the second intermediate inlet hole 342*b*, and the second lower inlet hole 342*c* may be disposed to be spaced apart from each other by an interval (e.g., a predetermined interval) in the vertical direction. Accordingly, the second inlet hole 342 may prevent foreign substances from accumulating in the second lower inlet hole 342*c* when the flame or gas discharged from the battery module 200 passes through the second upper inlet hole 342*a*, the second intermediate inlet hole 342*b*, and the second lower inlet hole 342*c*.

The second upper inlet hole 342*a*, the second intermediate inlet hole 342*b*, and the second lower inlet hole 342*c* may be respectively provided as a plurality of second upper inlet holes 342*a*, a plurality of second intermediate inlet holes 342*b*, and a plurality of second lower inlet holes 342*c*. The plurality of second upper inlet holes 342*a*, the plurality of second intermediate inlet holes 342*b*, and the plurality of second lower inlet holes 342*c* may be arranged in parallel in the width direction of the first door frame 310.

The cross-sectional shapes of the second upper inlet hole 342*a*, the second intermediate inlet hole 342*b*, and the second lower inlet hole 342*c* may be various shapes, such as a circular shape, a polygonal shape, and the like in addition to an elliptical shape illustrated in FIGS. 4 and 5.

The discharge hole 350 may have the shape of a hole (e.g., an opening) that passes through the second door frame 320 in a thickness direction of the second door frame 320 and is elongated vertically. The discharge hole 350 may discharge, from the inside of the door channel 330, the flame or gas introduced into the door channel 330. The discharge hole 350 may be disposed to be misaligned with (e.g., offset from) the first inlet hole 341 and the second inlet hole 342. For example, the discharge hole 350 may be disposed in a location that does not directly face the first inlet hole 341 and the second inlet hole 342. In one embodiment, the discharge hole 350 may be disposed between the first inlet hole 341 and the second inlet hole 342 of the second door frame 320 and may be connected to (e.g., may be in fluid communication with) a region of a central portion of the door channel 330. A width of the discharge hole 350 may be smaller than a distance between the first inlet hole 341 and the second inlet hole 342. Accordingly, the discharge hole 350 may guide the flame or gas introduced into the first inlet hole 341 and the second inlet hole 342 to be discharged from the door channel 330 after sufficiently moving in an extension direction of the door channel 330, and thus, the movement speed of the flame or gas may be reduced more effectively.

A ratio of an area of the inlet hole 340 to an area of the discharge hole 350 may be in a range of about 50% or more and about 80% or less. The area of the inlet hole 340 may be the sum of the areas of the first upper inlet hole 341*a*, the first intermediate inlet hole 341*b*, the first lower inlet hole 341*c*, the second upper inlet hole 342*a*, the second intermediate inlet hole 342*b*, and the second lower inlet hole 342*c*. When the ratio of the area of the inlet hole 340 to the area of the discharge hole 350 is less than about 50%, the area through which the flame or gas generated inside the cabinet 100 is introduced into the door channel 330 may be excessively reduced, thereby lowering the discharge performance of the flame or gas. When the ratio of the area of the inlet hole 340 to the area of the discharge hole 350 is greater than about 80%, the movement speed of the flame or gas introduced into the inlet hole 340 may be excessively increased, thereby lowering the deceleration performance of the flame by the door channel 330.

The blocking member 360 may be disposed to face the discharge hole 350 and block the flame, after it is discharged from the discharge hole 350, from passing therethrough. At the same time, the blocking member 360 may allow the gas discharged from the discharge hole 350 to pass therethrough.

The blocking member 360 may include a blocking filter 361 and a fixing bracket 362.

The blocking filter 361 may have a plate shape in which a plurality of mesh holes that can allow the gas discharged from the discharge hole 350 to pass therethrough but block the flame from passing therethrough are arranged in a lattice pattern. The blocking filter 361 may be made of a highly heat-resistant material, for example, at least one of stainless steel, copper, nickel, titanium, silver, tungsten, aluminum, or an alloy thereof. The blocking filter 361 may be disposed to face the discharge hole 350 outside the second door frame 320. In another embodiment, the blocking filter 361 may be disposed to face the discharge hole 350 inside the door channel 330. The blocking filter 361 may be provided as a plurality of blocking filters 361. The plurality of blocking filters 361 may be stacked in the direction in which the discharge hole 350 passes through the second door frame 320 or in the thickness direction of the second door frame 320.

The fixing bracket 362 may support the blocking filter 361 with respect to the second door frame 320. The fixing bracket 362 may be disposed to face the outer surface of the second door frame 320 with the blocking filter 361 interposed therebetween. An inner region of the fixing bracket 362 may be disposed to surround (e.g., to extend around) an edge of the blocking filter 361 and may be fixed to the edge of the blocking filter 361 by welding, bolting, etc. An outer region of the fixing bracket 362 may be in contact with the second door frame 320 and may be fixed to the second door frame 320 by welding, bolting, etc.

The energy storage system, according to the illustrated embodiment, may further include a canopy 370.

The canopy 370 may be disposed to face the blocking member 360 and guide the discharge of the gas that has passed through the blocking member 360.

The canopy 370 may include a canopy body 371 and a guide hole 372.

The canopy body 371 may have a box shape with an empty interior and an open side. The canopy body 371 may be disposed so that the open side thereof faces the blocking member 360. An area of the canopy body 371 may be greater than an area of the blocking member 360, and an edge region of the canopy body 371 may be fixed to the outer surface of the second door frame 320 by welding, bolting, etc. Accordingly, the canopy body 371 can prevent foreign substances contained in the gas that has passed through the blocking filter 361 from scattering to the outside of the cabinet 100.

The guide hole 372 may be formed to pass through the canopy body 371 and guide the discharge direction of the gas introduced into the canopy body 371. Accordingly, the guide hole 372 may guide the gas discharged to the outside of the cabinet 100 to move in a direction (e.g., a predetermined direction), and thus, damage to adjacent parts or the like that are sensitive to contact with the gas can be prevented.

The guide hole 372 may pass through a side surface of the canopy body 371 and may extend in a vertical direction. For example, the guide hole 372 may be provided as a pair of guide holes 372. The pair of guide holes 372 may be disposed to pass through upper and lower surfaces of the canopy body 371 and may face upwardly and downwardly, respectively. In other embodiments, the guide hole 372 may be formed as a single guide hole 372 and may be disposed to pass through the upper or lower surface of the canopy body 371 and face upwardly or downwardly. Accordingly, the guide hole 372 may prevent the gas discharged from the cabinet 100 from being sprayed toward a worker located adjacent to the cabinet 100.

The energy storage system according to the illustrated embodiment may further include a first channel 400.

The first channel 400 may be disposed to face a vent B of the battery module 200 and may provide a primary movement path for the flame or gas discharged from the vent B. Because the battery modules 200 are vertically stacked inside the first accommodation space 115 or the second accommodation space 116, examples of the first channel 400 may include an empty space between the adjacent battery modules 200 disposed (e.g., stacked) vertically. A longitudinal direction of the first channel 400 may extend in the first direction, for example, the longitudinal direction of the cabinet 100.

The first channel 400 may be provided as a plurality of first channels 400. The plurality of first channels 400 may be individually disposed between the vertically adjacent battery modules 200. The first channels 400 may be arranged in two rows in the second direction. The first channels 400 arranged in different rows may be formed in the first accommodation space 115 and the second accommodation space 116.

The first channel 400 may have a first end portion 410 and a second end portion 420.

The first end portion 410 and the second end portion 420 may be disposed to be spaced apart from each other in the first direction. The first end portion 410 may be disposed to face the inner surface of the door 300, for example, to be spaced from the inner surface of the first door frame 310 by an interval (e.g., by a predetermined interval). The second end portion 420 may be disposed to face the inner surface of the end cover 132 and to be spaced from the inner surface of the end cover 132 by an interval (e.g., by a predetermined interval).

The energy storage system according to the illustrated embodiment may further include a first partition P1 and a second partition P2.

The first partition P1 may be disposed between the side cover 131 and the battery module 200. The first partition P1 may have a substantially flat plate shape. Each of both surfaces (e.g., opposite surfaces) of the first partition P1 may be disposed to face one of the inner surface of the side cover 131 and a side surface of the battery module 200 in parallel. The first partition P1 may be made of a material with relatively higher heat resistance and insulation ability than the side cover 131. For example, the side cover 131 may be made of a metal material, such as steel, aluminum, or the like, and the first partition P1 may be made of a material, such as mica or the like. Accordingly, the first partition P1 may lower the temperature of (or may slow the increase of the temperature of) the side cover 131 in the event of a fire and may prevent damage to the side cover 131 due to the flame, thereby preventing the spread of fire to adjacent equipment installed outside the cabinet 100.

The first partition P1 may be provided as a plurality of first partitions P1. Some of the plurality of first partitions P1 may be disposed between the battery modules 200 disposed inside the first accommodation space 115 and any one side cover 131. The rest of the plurality of first partitions P1 may be disposed between the battery modules 200 disposed inside the second accommodation space 116 and the other side cover 131.

The plurality of first partitions P1 facing the battery modules 200 disposed inside the first accommodation space 115 may be individually disposed between a pair of adjacent first outer frames 112. The plurality of first partitions P1 facing the battery modules 200 disposed inside the second accommodation space 116 may be individually disposed between a pair of adjacent second outer frames 113. An inner surface of the first partition P1 may be in contact with a side surface of the support rail 120. Accordingly, the first partition P1 can prevent the flame or smoke introduced into the first channel 400 from being discharged to the outside through a side surface of the first channel 400.

The second partition P2 may be disposed between the battery modules 200 arranged in different rows. For example, the second partition P2 may be disposed between the first accommodation space 115 and the second accommodation space 116. The second partition P2 may have a substantially flat plate shape. Each of both surfaces (e.g., opposite surfaces) of the second partition P2 may be disposed to face one of the side surface of the battery module 200 disposed inside the first accommodation space 115 and the side surface of the battery module 200 disposed inside the second accommodation space 116 in parallel. The second partition P2 may be made of the same material as the first partition P1. Accordingly, the second partition P2 may prevent a fire occurring in any one of the first accommodation space 115 and the second accommodation space 116 from spreading to the other of the first accommodation space 115 and the second accommodation space 116.

The second partition P2 may be provided as a plurality of second partitions P2. The plurality of second partitions P2 may be individually disposed between a pair of adjacent inner frames 114. An inner surface of the second partition P2 may be in contact with the side surface of the support rail 120. Accordingly, the second partition P2, together with the first partition P1, may prevent the flame or smoke introduced into the first channel 400 from being discharged to the outside through the side surface of the first channel 400.

Hereinafter, operation of the energy storage system according to the illustrated embodiment of the present disclosure will be described.

Figure 8:
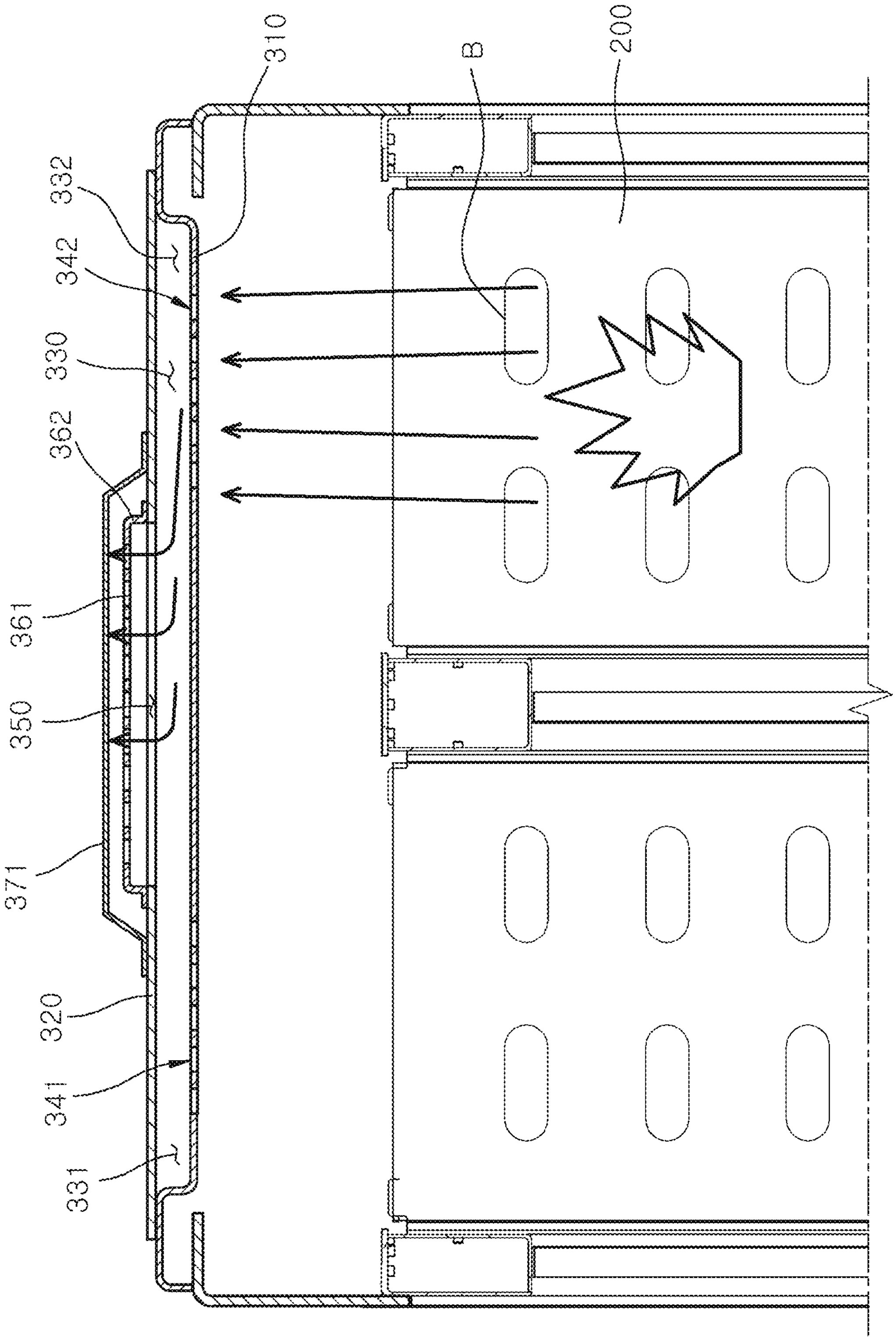
FIGS. 8 and 9 are schematic illustrations of an operation process of the energy storage system shown in FIGS. 1-7.
Figure 9:
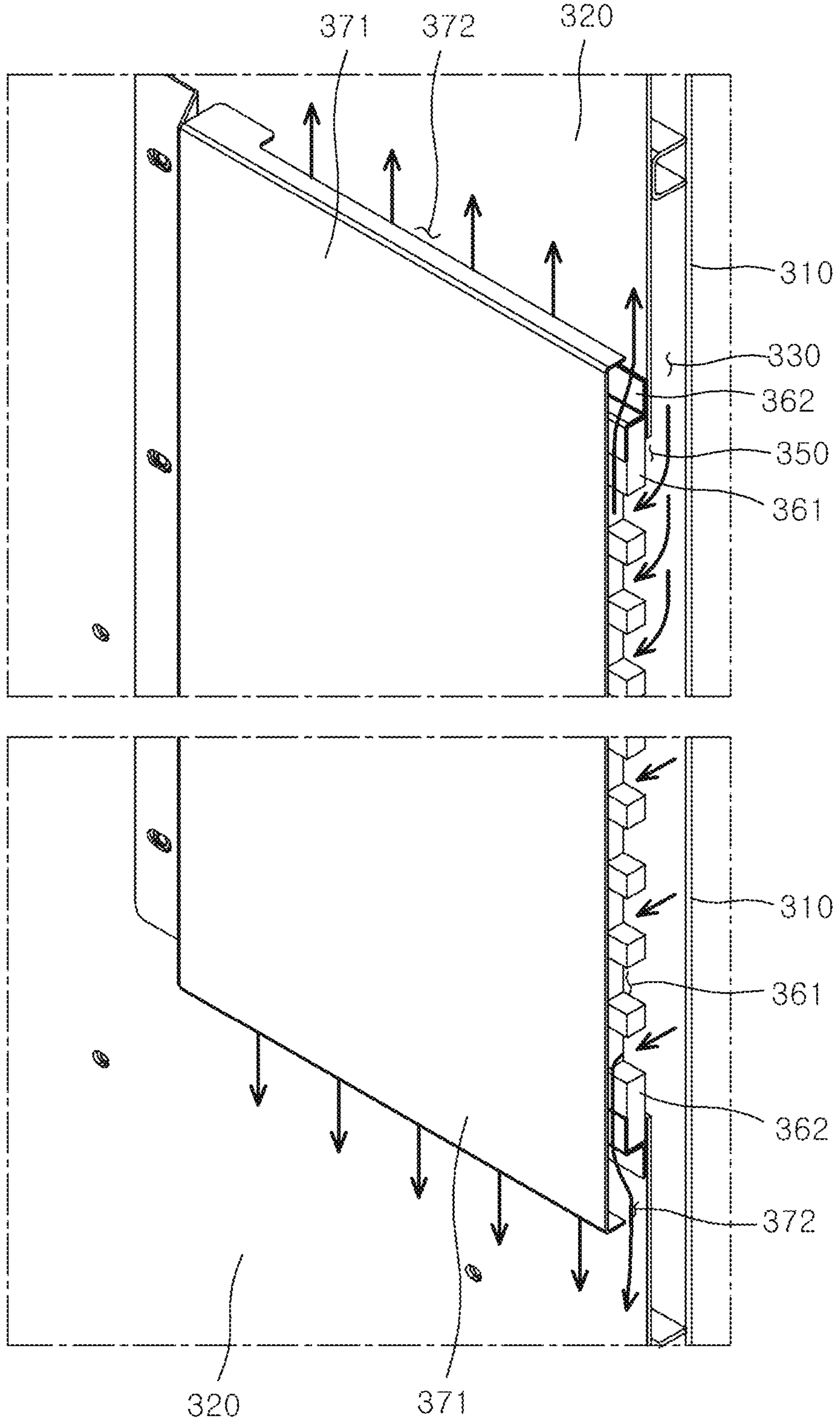

FIGS. 8 and 9 are views schematically illustrating an operation process of the energy storage system as described with reference to FIGS. 1-7.

Referring to FIGS. 8 and 9, when a fire occurs in any one of the battery modules 200, a flame or gas discharged from the vent B of the corresponding battery module 200 may be introduced into the first channel 400 facing the vent B of the corresponding battery module 200.

The flame or gas introduced into the first channel 400 may be moved (or directed) toward the first end portion 410 and the second end portion 420 in an extension direction of the first channel 400.

The flame or gas discharged from the first end portion 410 may be introduced into the door channel 330 through the first inlet hole 341 or the second inlet hole 342.

Because the first inlet hole 341 and the second inlet hole 342 are connected to (e.g., in fluid communication with) the first inlet end portion 331 and the second inlet end portion 332, respectively, the flame or gas introduced into the first inlet hole 341 or the second inlet hole 342 may be moved to (or directed to) a region of a central portion of the door channel 330 in the extension direction of the door channel 330.

In this process, the extension direction of the door channel 330 crosses the direction in which the first inlet hole 341 and the second inlet hole 342 pass through the first door frame 310, and thus, the movement speed of the flame or gas introduced into the door channel 330 may be reduced.

The flame or gas moved to the central portion of the door channel 330 may be introduced into the discharge hole 350 and may come into contact with the blocking filter 361. The blocking filter 361 may block the flame from passing therethrough by absorbing the heat of the flame through heat exchange with the flame.

The gas introduced into the discharge hole 350 may pass through the mesh holes of the blocking filter 361 and may be transmitted into the canopy body 371.

The gas introduced into the canopy body 371 may be finally discharged upwardly or downwardly from the inside of the cabinet 100 through the guide hole 642.

Hereinafter, an energy storage system according to another embodiment of the present disclosure will be described.

Figure 10:
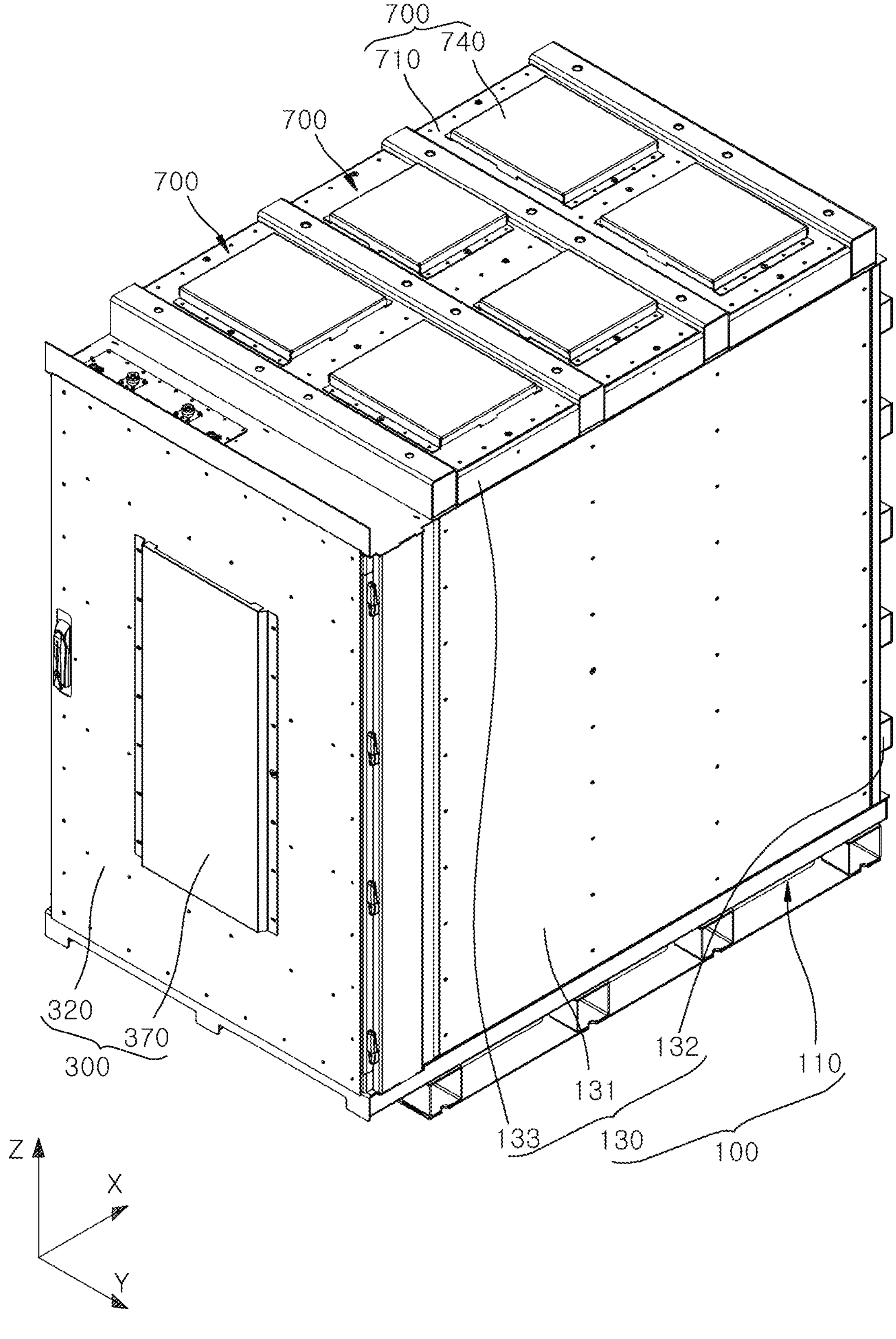
FIG. 10 is a perspective view schematically illustrating an energy storage system according to another embodiment of the present disclosure.
Figure 11:
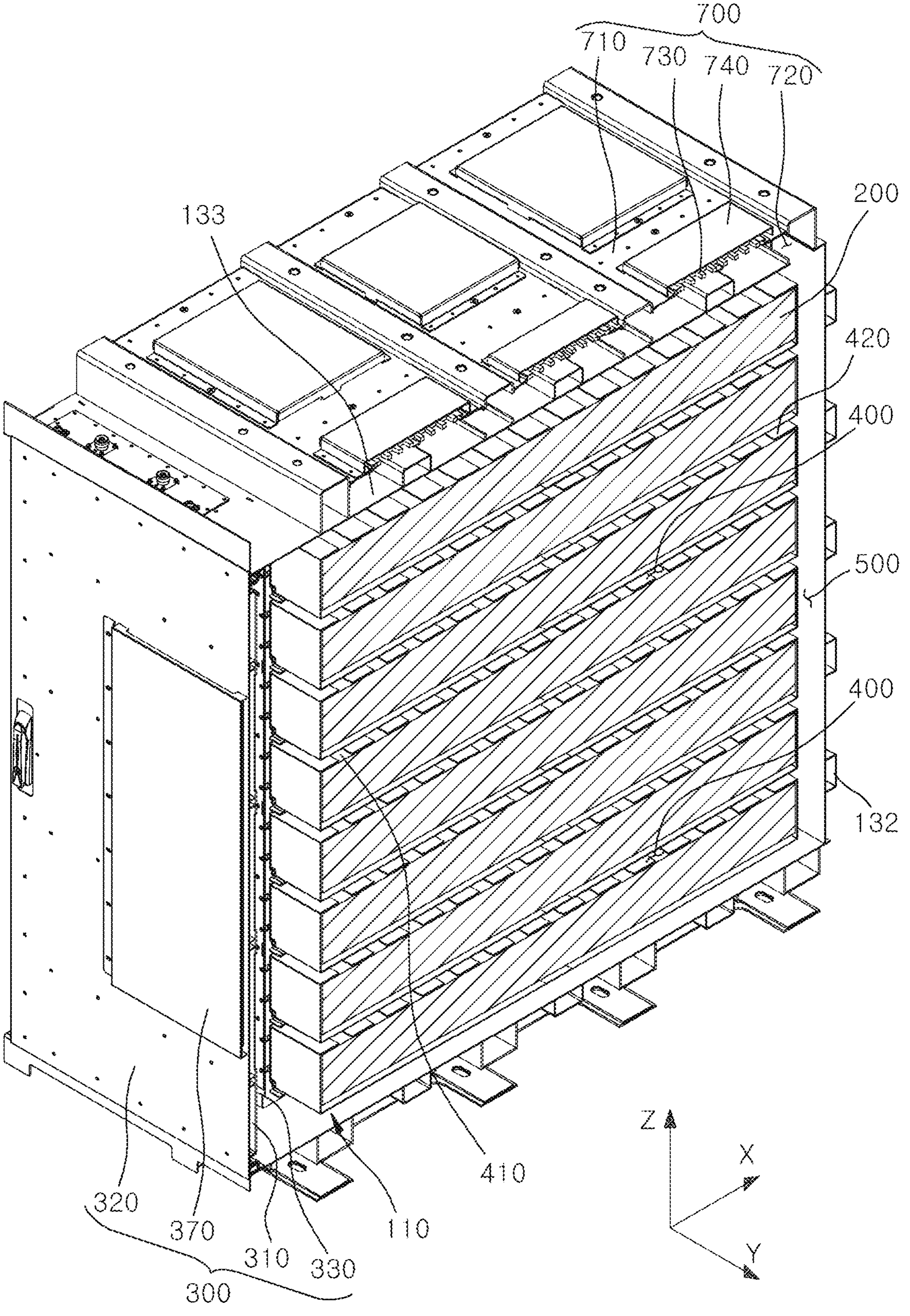
FIG. 11 is a cross-sectional perspective view schematically illustrating the configuration of the energy storage system according to the second embodiment of the present disclosure.
Figure 12:
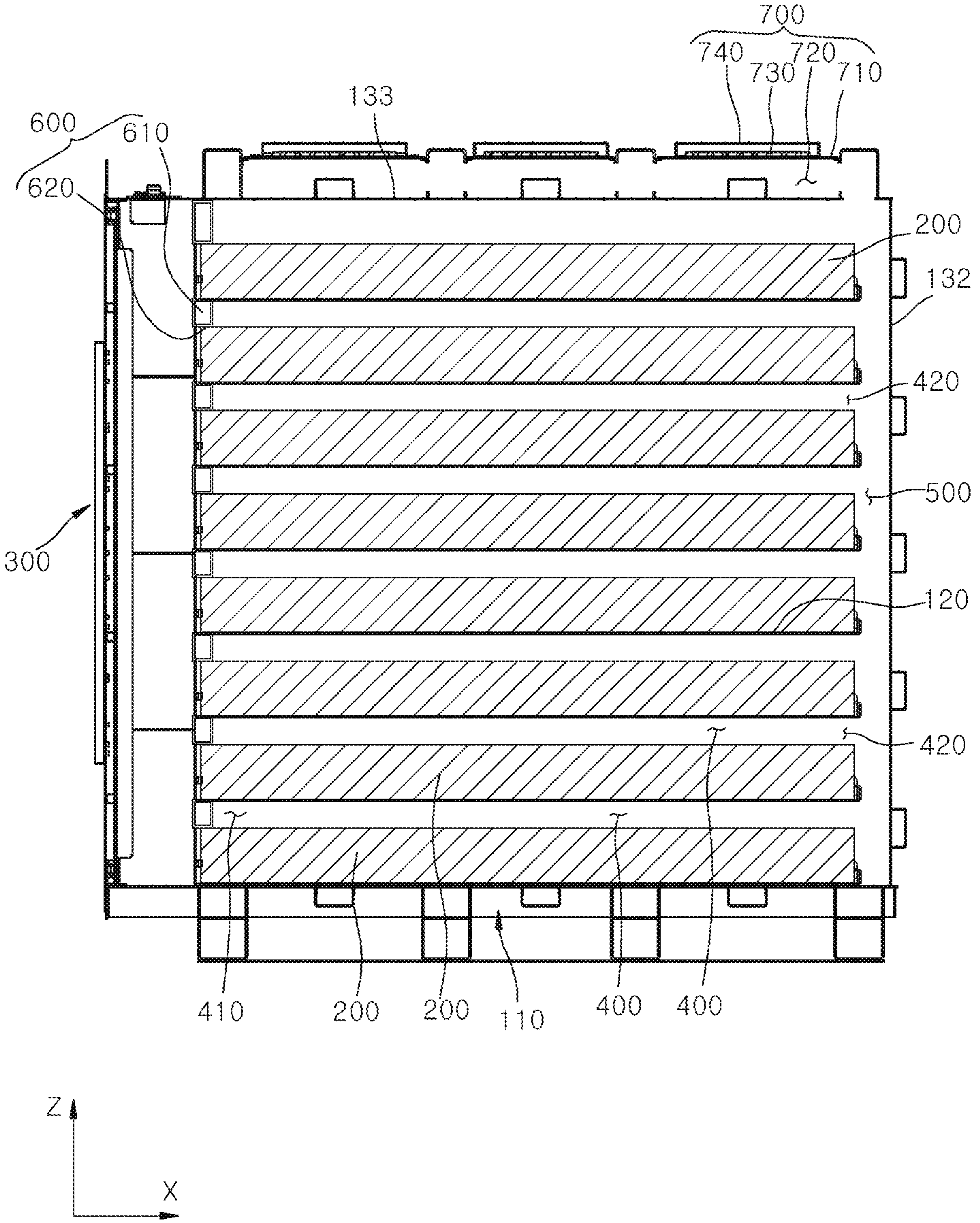
FIG. 12 is a side cross-sectional view schematically illustrating the energy storage system shown in FIG. 11.
Figure 13:
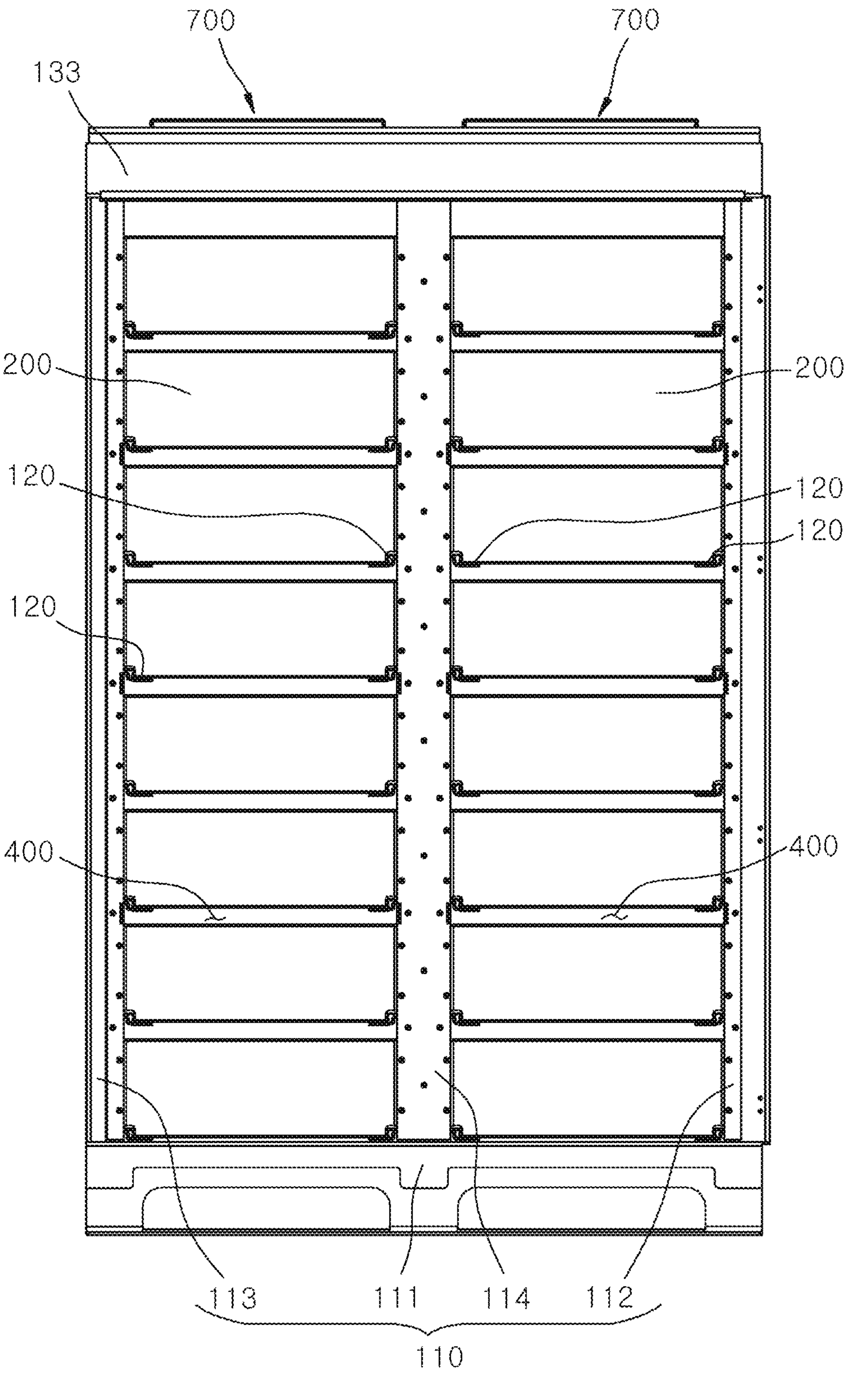
FIG. 13 is a front cross-sectional view schematically illustrating the energy storage system shown in FIGS. 11 and 12.
Figure 14:
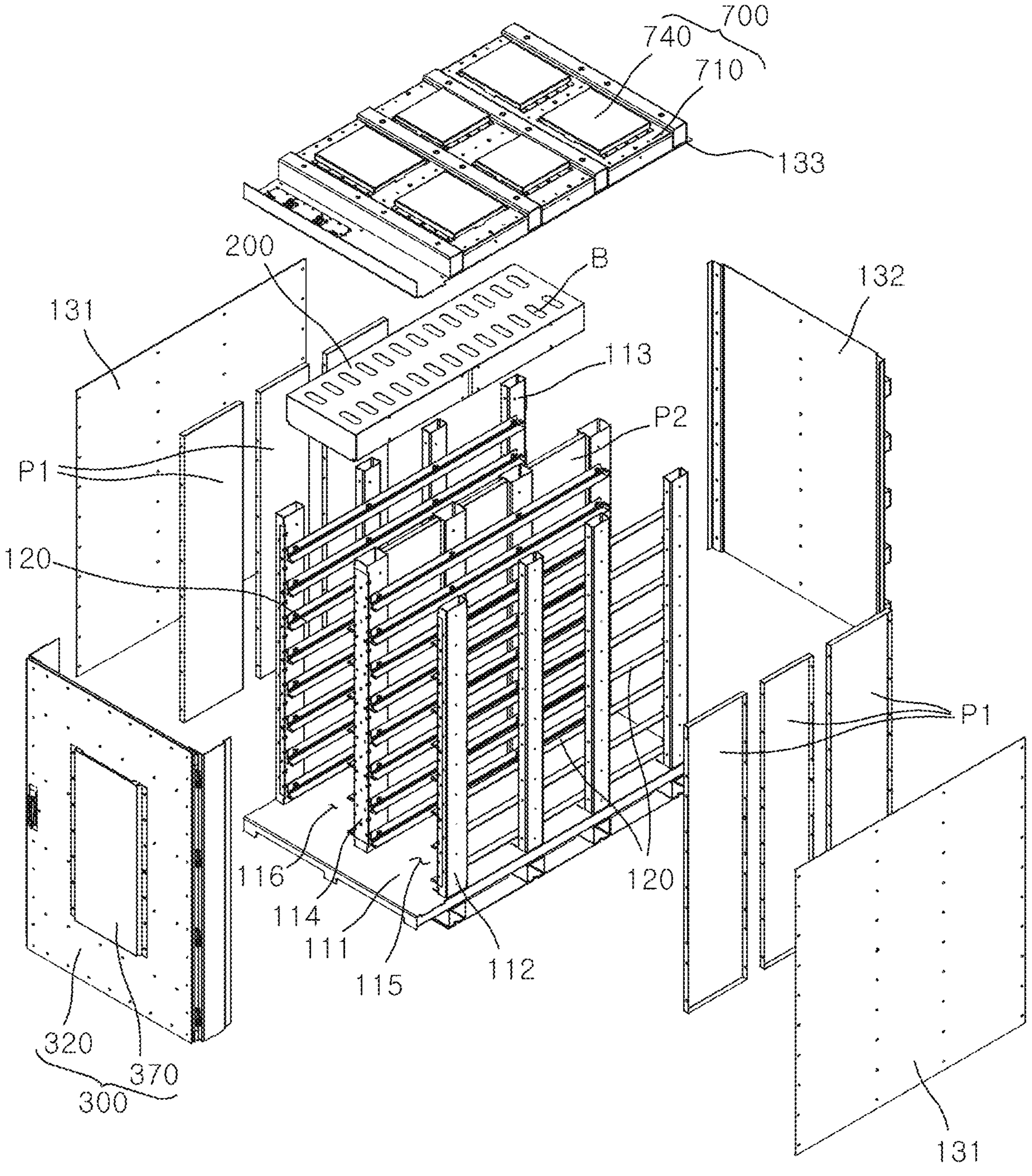
FIG. 14 is an exploded perspective view schematically illustrating a cabinet of the energy storage system shown in FIGS. 11-13.

FIG. 10 is a perspective view schematically illustrating an energy storage system according to another embodiment of the present disclosure, FIG. 11 is a cross-sectional perspective view schematically illustrating the energy storage system shown in FIG. 10, FIG. 12 is a side cross-sectional view schematically illustrating the energy storage system shown in FIGS. 10 and 11, FIG. 13 is a front cross-sectional view schematically illustrating the energy storage system shown in FIGS. 10-12, and FIG. 14 is an exploded perspective view schematically illustrating a cabinet of the energy storage system shown in FIGS. 10-13.

Referring to FIGS. 10 to 14, the energy storage system according to the illustrated embodiment may further include a second channel 500, a guide member 600, and a main discharge member 700.

The energy storage system according to the illustrated embodiment may differ from the energy storage system described above with reference to FIGS. 1 to 9 in that a second channel 500, a guide member 600, and a main discharge member 700 are further included.

Accordingly, in describing the energy storage system according to the present embodiment, the second channel 500, the guide member 600, and the main discharge member 700 that were not described with reference to FIGS. 1 to 9 will be primarily described.

The second channel 500 may be disposed inside the cabinet 100 and may be connected to (e.g., may be in fluid communication with) the second end portion 420 of the first channel 400. The second channel 500 may provide a secondary movement path for the flame or gas that has passed through the first channel 400. Examples of the second channel 500 may include an empty space disposed between a rear surface of the battery module 200 and an inner surface of the end cover 132. The second channel 500 may be disposed to cross the first channel 400. For example, the second channel 500 may extend vertically in the height direction of the cabinet 100. One surface of the second channel 500 may be connected to (e.g., may be open to) the second end portions 420 of the plurality of first channels 400.

A volume of the second channel 500 may be greater than a volume of the first channel 400. For example, the volume of the first channel 400 may be about 6.5 L, and the volume of the second channel 500 may be about 38.6 L. Accordingly, the second channel 500 maintains a relatively lower pressure than the first channel 400 so that the flame or gas discharged from the vent B may be naturally transmitted from the first channel 400 to the second channel 500 without any external force.

The guide member 600 is installed in the first channel 400 and guides the movement of the flame or gas discharged from the vent B in the first direction. For example, the guide member 600 may guide the flame or gas discharged from the vent B to move toward the second end portion 420 connected to the second channel 500. Accordingly, the guide member 600 may prevent secondary damage, such as ignition of the communication device and control device installed on the front surface of the battery module 200, damage to the door 300 due to pressure of gas, or the like, etc., in the event of a fire.

Figure 15:
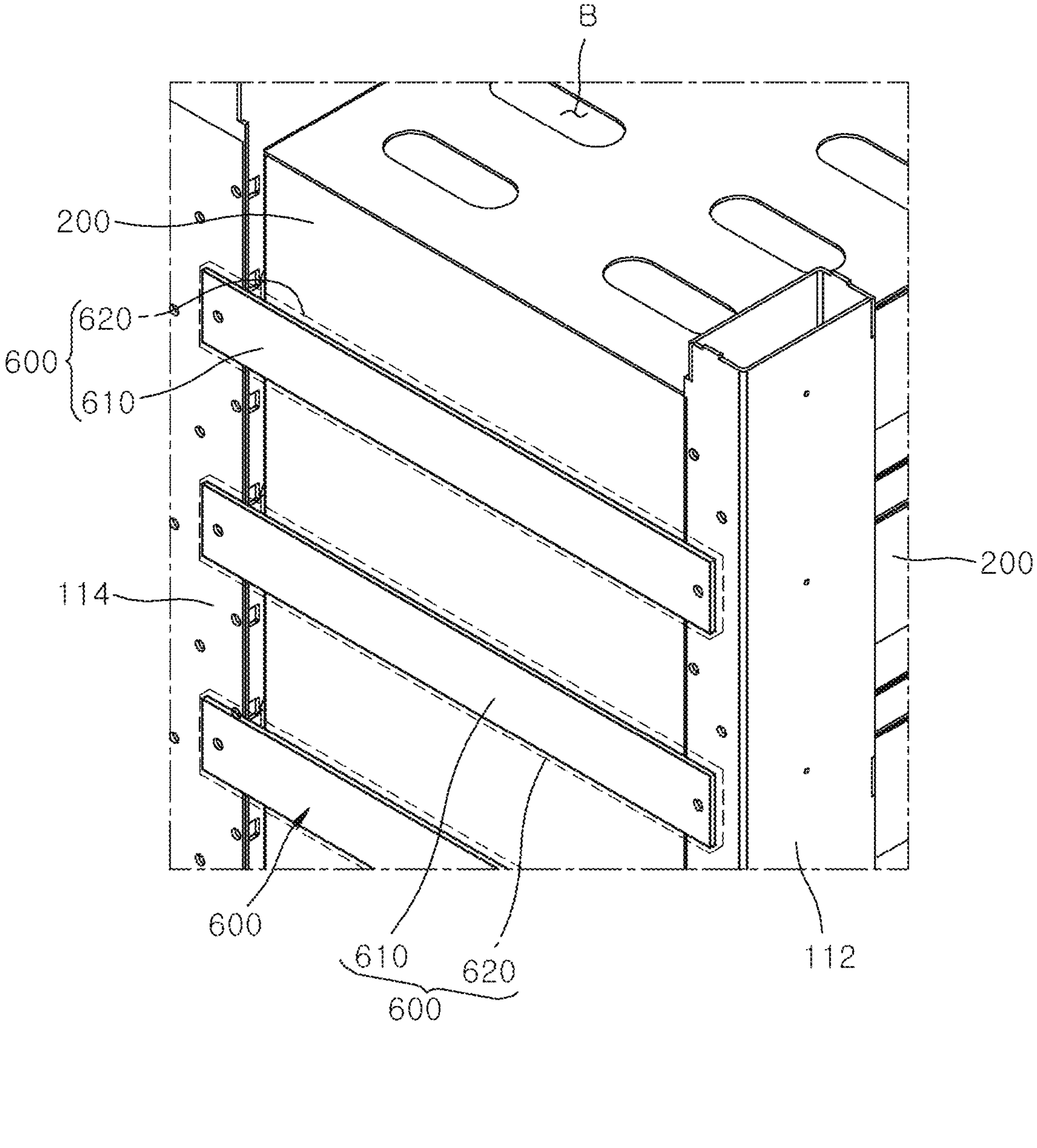
FIG. 15 is a perspective view schematically illustrating a guide member of the energy storage system shown in FIGS. 11-14.

FIG. 15 is a perspective view schematically illustrating a guide member of the energy storage system described above with reference to FIGS. 10-14, and FIG. 16 is a cross-sectional view schematically illustrating the guide member shown in FIG. 15.

Figure 16:
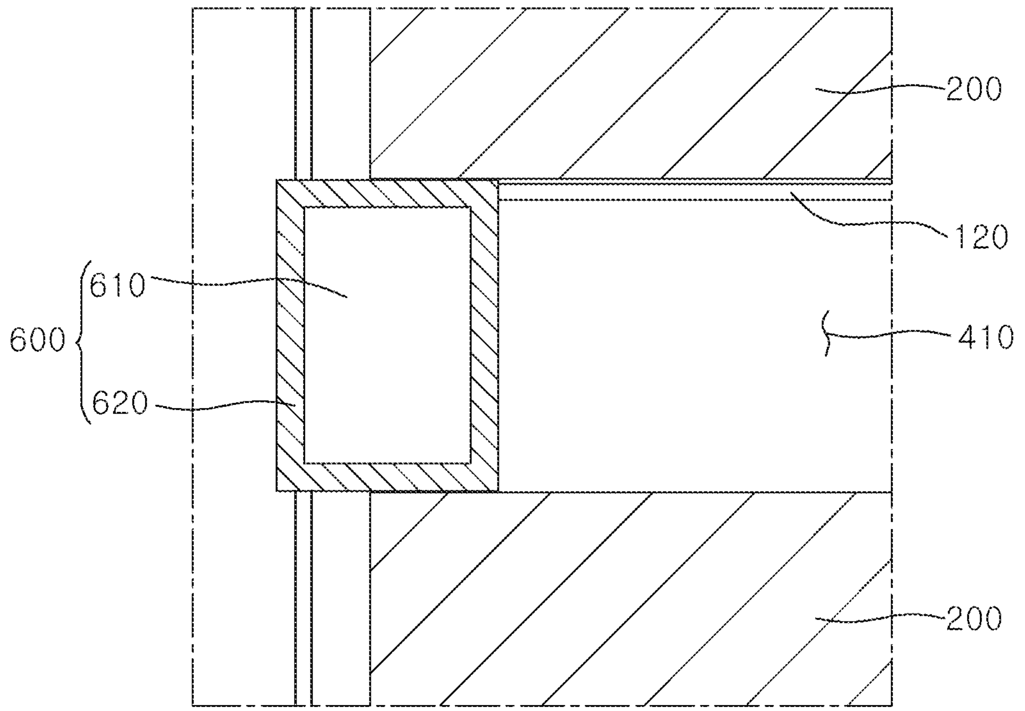
FIG. 16 is a cross-sectional view schematically illustrating the guide member shown in FIG. 15.

Referring to FIGS. 15 and 16, the guide member 600 may include a guide vane 610 and a sealing member 620.

The guide vane 610 may block the flame or gas introduced into the first channel 400 from being discharged to the first end portion 410. The guide vane 610 may have substantially a plate shape and may be disposed between the first end portion 410 and the door 300. Each of both surfaces of the guide vane 610 may be disposed to face one of the first end portion 410 and the door 300. A vertical width of the guide vane 610 may be greater than a vertical width of the first channel 400.

The guide vane 610 may be provided as a plurality of guide vanes 610. The plurality of guide vanes 610 may be individually disposed to face the first end portions 410 of the respective first channels 400 stacked in the vertical direction. The plurality of guide vanes 610 may be arranged in two rows in the second direction. Each of both end portions (e.g., opposite end portions) of the guide vane 610 disposed to face the first channel 400 formed in the first accommodation space 115 may be fixed to one of the first outer frame 112 and the inner frame 114. Each of both end portions (e.g., opposite end portions) of the guide vane 610 disposed to face the first channel 400 formed in the second accommodation space 116 may be fixed to one of the second outer frame 113 and the inner frame 114.

The guide vane 610 may be made of a metal material with high rigidity, such as steel or the like, to prevent damage due to pressure of the gas or the like introduced into the first channel 400.

The sealing member 620 may be coupled to the guide vane 610 and may seal a gap between the first end portion 410 and the guide vane 610. The sealing member 620 may be elastically deformable. For example, the sealing member 620 may completely seal the first end portion 410 by filling a gap between the guide vane 610, which is made of a rigid body, and the battery module 200 with its own elastic deformation. The sealing member 620 may be made of a flexible material, such as rubber, silicon, or the like, and may entirely surround (e.g., may extend entirely around) an outer surface of the guide vane 610.

The main discharge member 700 may be connected to the second channel 500 and may discharge the gas introduced into the second channel 500 to the outside of the cabinet 100. Further, the main discharge member 700 may block the flame introduced into the second channel 500 from being discharged to the outside of the cabinet 100. Accordingly, the main discharge member 700 may prevent the internal pressure of the cabinet 100 from excessively increasing in the event of a fire, and at the same time, may prevent the spread of the fire due to the outflow of the flame.

Figure 17:
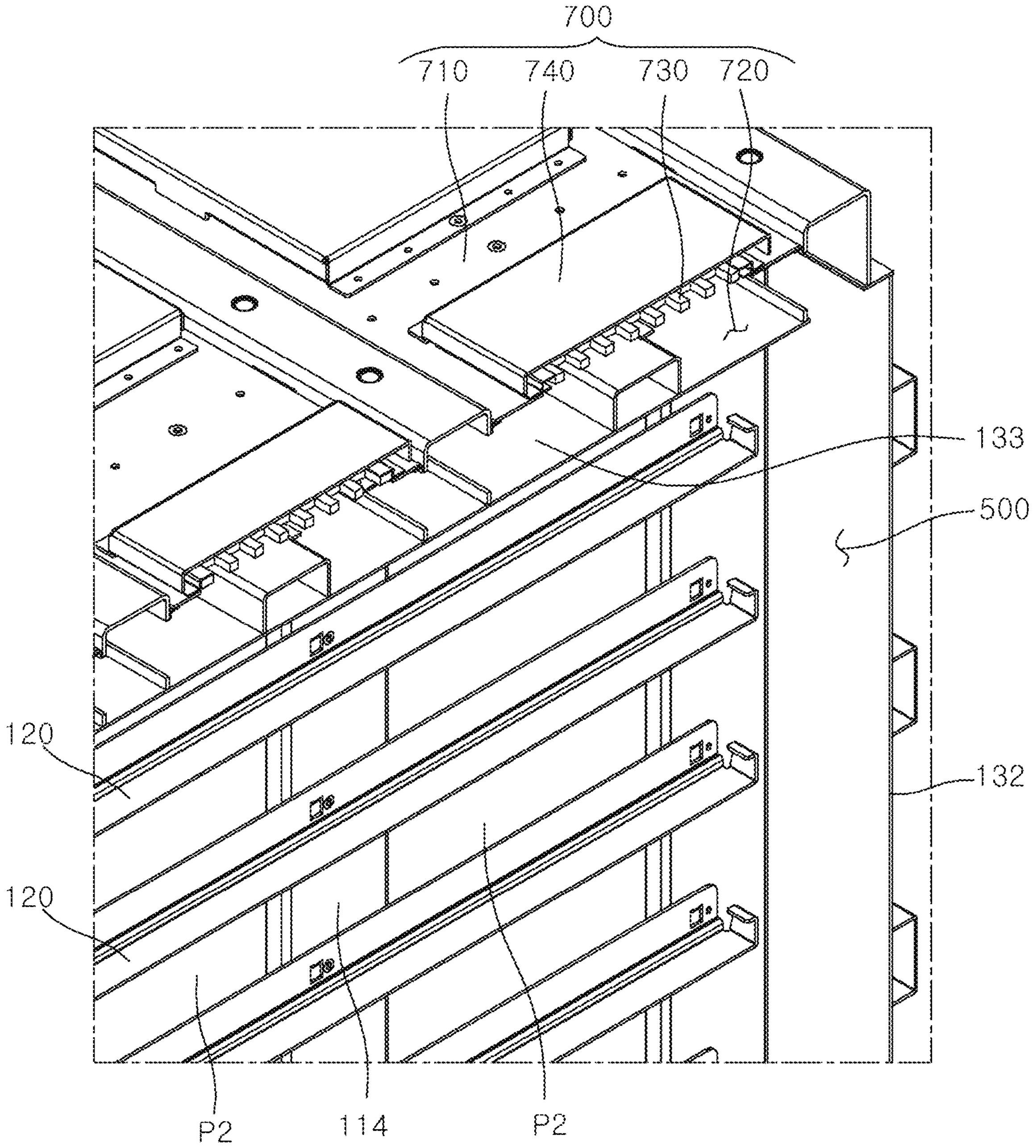
FIG. 17 is a cross-sectional perspective view schematically illustrating a main discharge member of the energy storage system shown in FIGS. 11-14.

FIG. 17 is a cross-sectional perspective view schematically illustrating a main discharge member of the energy storage system described above with reference to FIGS. 10-16, and FIG. 18 is an exploded perspective view schematically illustrating the main discharge member shown in FIG. 17.

Figure 18:
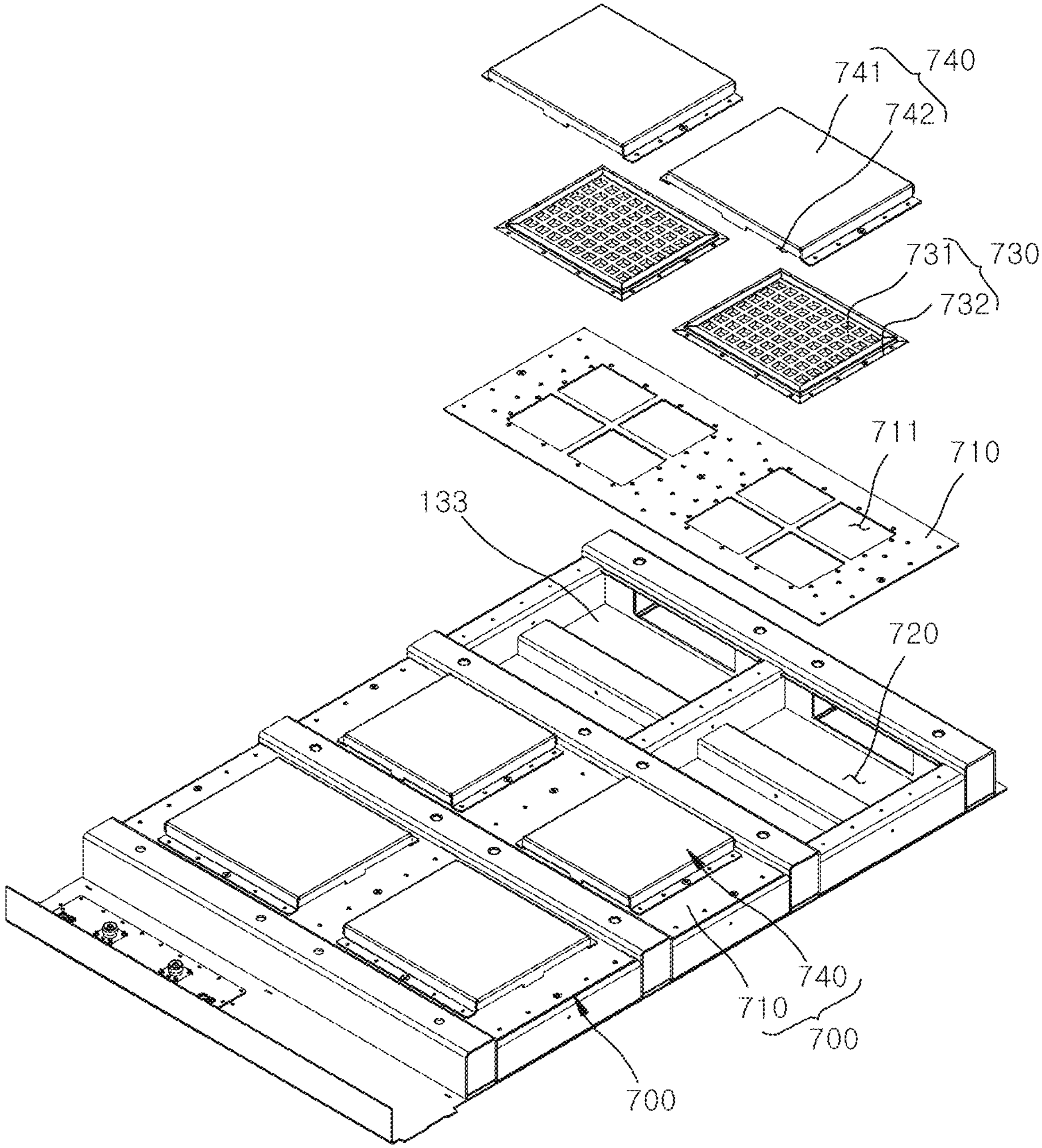
FIG. 18 is an exploded perspective view schematically illustrating the main discharge member shown in FIG. 17.

Referring to FIGS. 17 and 18, the main discharge member 700 may include a discharge plate 710, a third channel 720, a main blocking member 730, and a main canopy 740.

The discharge plate 710 may be disposed in an outer side of the cabinet 100. For example, the discharge plate 710 may have a substantially flat plate shape, and a lower surface of the discharge plate 710 may be disposed to face an upper surface of the top cover 133. The lower surface of the discharge plate 710 may be disposed to be spaced from the upper surface of the top cover 133 by an interval (e.g., by a predetermined interval). Accordingly, a the third channel 720, which will be described below, can be formed between the discharge plate 710 and the top cover 133. The discharge plate 710 may be provided as a plurality of discharge plates 710. The plurality of discharge plates 710 may be disposed parallel to each other on the top cover 133.

A discharge hole (e.g., a discharge opening) 711 may be formed in the discharge plate 710 to provide a path through which the flame or gas introduced into the third channel 720, which will be described below, is discharged. The discharge hole 711 may vertically pass through the discharge plate 710. The discharge hole 711 may be provided as a plurality of discharge holes 711. The plurality of discharge holes 711 may be disposed to be spaced apart from each other in the discharge plate 710.

Examples of the third channel 720 may include an empty space formed inside the discharge plate 710, for example, between the discharge plate 710 and the top cover 133. One side of the third channel 720 may pass through the top cover 133 and may be connected to an upper end portion of the second channel 500. The other side of the third channel 720 may be connected to the discharge hole 711. The other side of the third channel 720 may be connected to all the plurality of discharge holes 711. The third channel 720 may be disposed to cross the second channel 500. For example, the third channel 720 may be disposed (e.g., may extend) perpendicular to the height direction of the cabinet 100. Accordingly, the third channel 720 may reduce the movement speed of the flame transmitted from the second channel 500 and, thus, the flame blocking performance of the main blocking member 730, which will be described below, may be further improved.

The main blocking member 730 may be disposed to face the discharge hole 711 and may block the flame introduced into the third channel 720 from passing through the discharge hole 711. At the same time, the main blocking member 730 may allow the gas introduced into the third channel 720 to pass through the discharge hole 711.

The main blocking member 730 may include a main blocking filter 731 and a filter bracket 732.

The main blocking filter 731 may have a plate shape including a plurality of mesh holes arranged in a lattice shape to allow the gas discharged from the discharge hole 711 to pass therethrough while blocking the flame from passing therethrough. The main blocking filter 731 may be made of a material with high heat resistance, for example, at least one of stainless steel, copper, nickel, titanium, silver, tungsten, aluminum, or an alloy thereof. The main blocking filter 731 may be disposed to face the discharge hole 711 in the discharge plate 710. In another embodiment, the main blocking filter 731 may be disposed to face the discharge hole 711 inside the third channel 720. The main blocking filter 731 may be provided as a plurality of main blocking filters 731. The plurality of main blocking filters 731 may be stacked in the direction in which the discharge holes 711 passes through the discharge plate 710, that is, in the vertical direction.

The filter bracket 732 may support the main blocking filter 731 with respect to the discharge plate 710. The filter bracket 732 may be disposed to face the discharge plate 710 with the main blocking filter 731 interposed therebetween. An inner region of the filter bracket 732 may be disposed to surround (e.g., to extend around) an edge of the main blocking filter 731 and may be fixed to the edge of the main blocking filter 731 by welding, bolting, etc. An outer region of the filter bracket 732 may be in contact with the discharge plate 710 and may be fixed to the discharge plate 710 by welding, bolting, etc.

The main canopy 740 may be disposed to face the main blocking member 730 and may guide the discharge of the gas that has passed through the main blocking member 730.

The main canopy 740 may include a main canopy body 741 and a main guide hole 742.

The main canopy body 741 may have a box shape with an empty interior and an open side. The main canopy body 741 may be disposed so that the open side thereof faces the main blocking member 730. An area of the main canopy body 741 may be greater than an area of the main blocking member 730, and an edge region of the main canopy body 741 may be fixed to the discharge plate 710 by welding, bolting, etc. Accordingly, the main canopy body 741 may prevent foreign substances contained in the gas that has passed through the main blocking filter 731 from scattering to the outside of the cabinet 100.

The main guide hole 742 may pass through the main canopy body 741 and may guide the discharge direction of the gas introduced into the main canopy body 741. Accordingly, the main guide hole 742 may guide the gas discharged to the outside of the cabinet 100 to move in a direction (e.g., a predetermined direction) and, thus, damage to adjacent parts or the like that are sensitive to contact with the gas can be prevented. The main guide hole 742 may vertically pass through a side surface of the main canopy body 741. The main guide hole 742 may be provided as a plurality of main guide holes 742. The plurality of main guide holes 742 may be disposed to be spaced apart from each other along a circumferential surface of the main canopy body 741.

Hereinafter, an operation process of the energy storage system described above with reference to FIGS. 10-18 will be described.

FIGS. 19 to 23 are views schematically illustrating an operation process of the energy storage system described above with reference to FIGS. 10-18.

Figure 19:
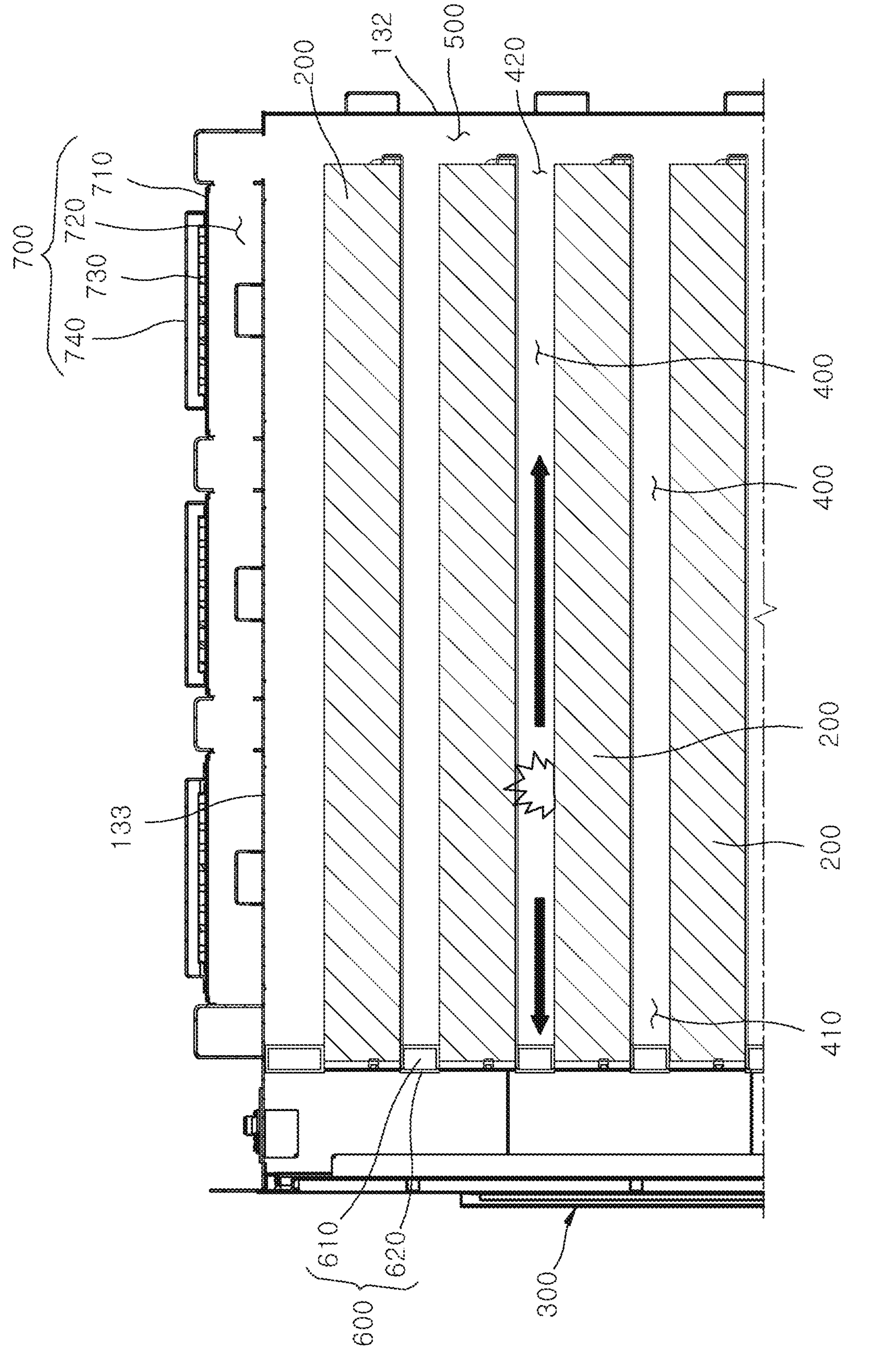
FIGS. 19 to 23 are schematic illustrations of an operation process of the energy storage system shown in FIGS. 11-18.

Referring to FIG. 19, when a fire occurs in any one battery module 200, a flame or gas discharged from the vent B of the corresponding battery module 200 may be introduced into the first channel 400 facing the vent B of the corresponding battery module 200.

The flame or gas introduced into the first channel 400 may be moved (or directed) toward the first end portion 410 and the second end portion 420 in an extension direction of the first channel 400.

Figure 20:
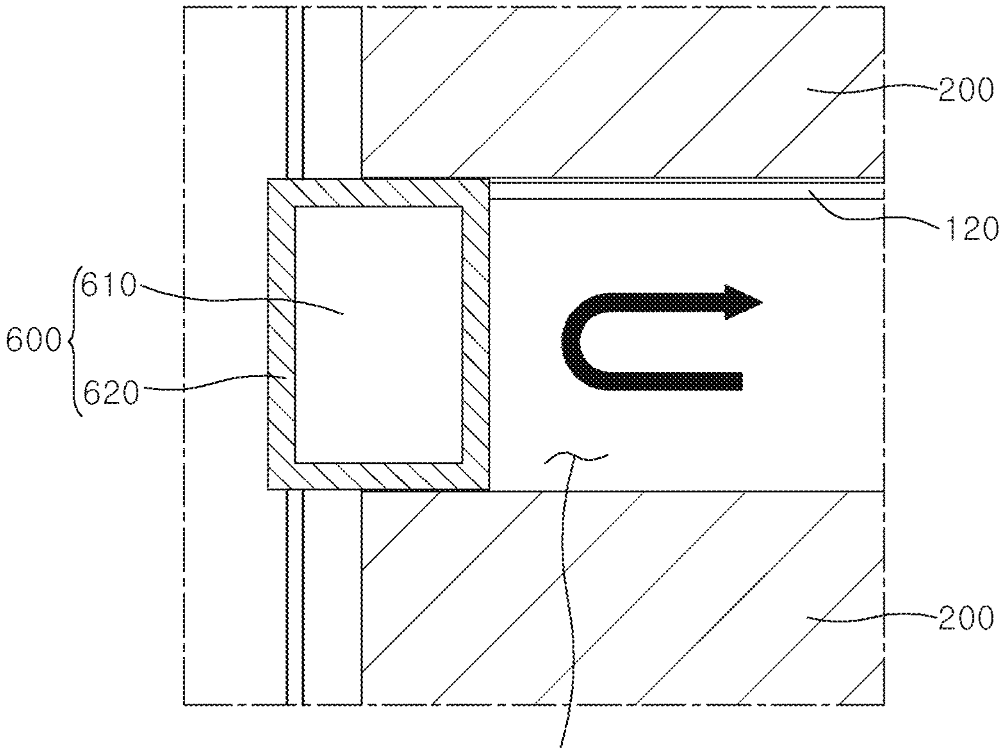

Referring to FIG. 20, the flame or gas moved toward the first end portion 410 may be blocked from being discharged to the outside of the first end portion 410 by the guide member 600, and the movement direction may be changed to a direction toward the second end portion 420, that is, the first direction, due to interference with the guide member 600.

Figure 21:
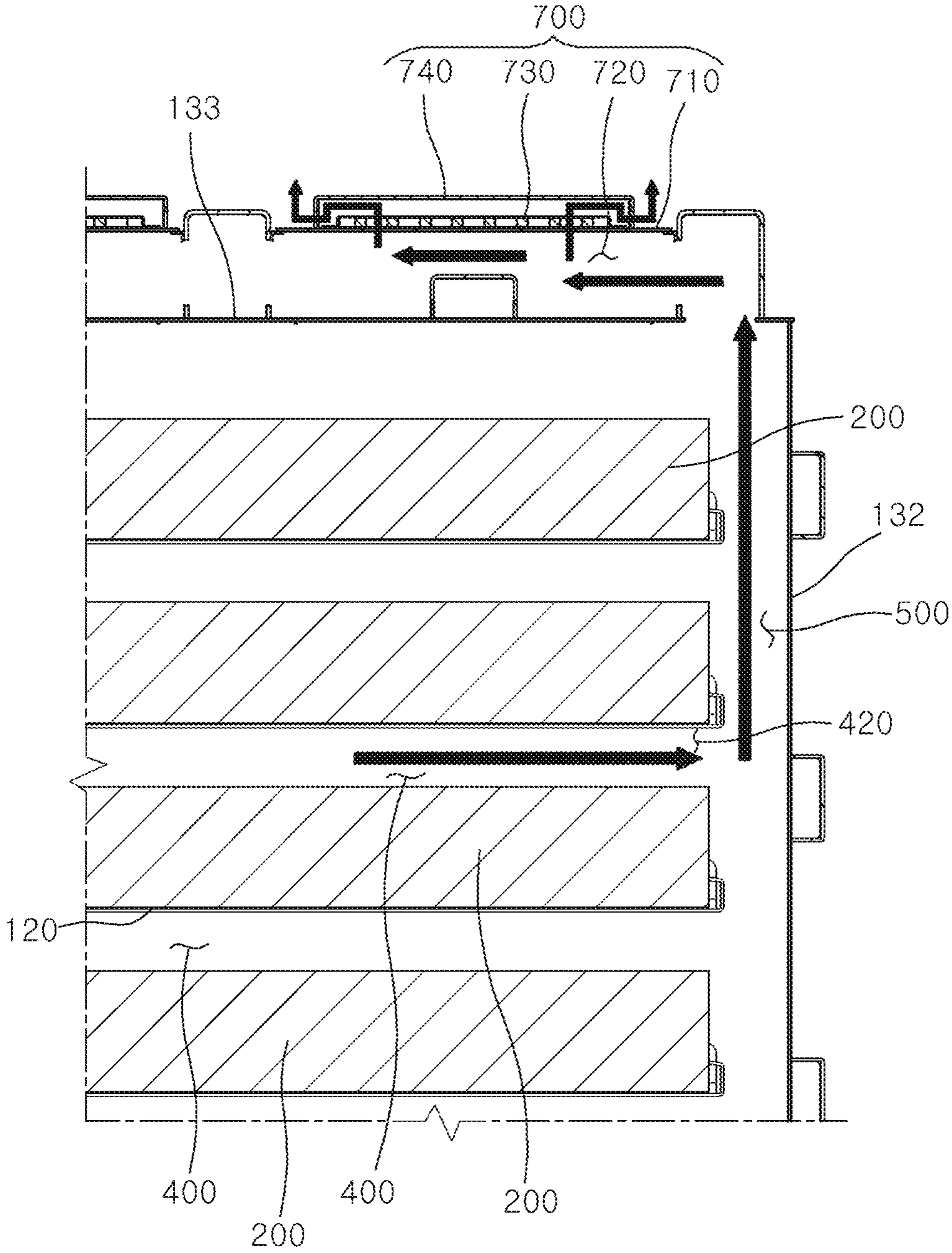

Referring to FIG. 21, the flame or gas moved toward the second end portion 420 may be introduced into the second channel 500. In the illustrated embodiment, the second channel 500 is disposed to cross the first channel 400, and thus, the movement speed of the flame or gas introduced into the second channel 500 may be reduced.

The flame or gas introduced into the second channel 500 may be moved (or directed) toward the upper end portion of the second channel 500 in an extension direction of the second channel 500, and introduced into the third channel 720. In the illustrated embodiment, the third channel 720 is disposed to cross the second channel 500, and thus, the movement speed of the flame or gas introduced into the second channel 500 may be further reduced.

In the illustrated embodiment, the volume of the second channel 500 is greater than the volume of the first channel 400, and thus, the flame or gas introduced into the first channel 400 may be continuously moved toward the second channel 500 without any additional external force.

Figure 22:
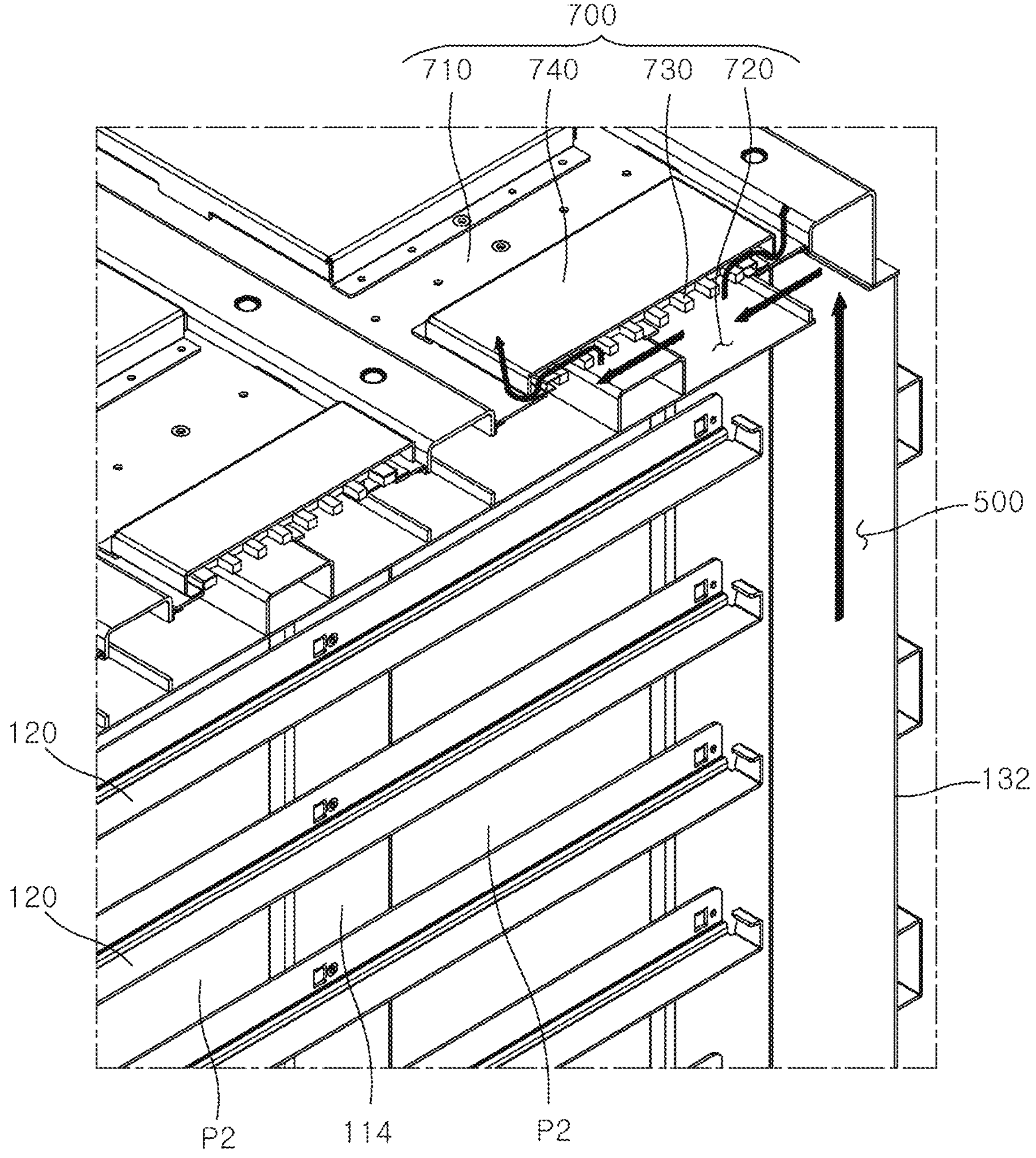

Referring to FIG. 22, the flame or gas introduced into the third channel 720 may be transmitted to the discharge hole 711 in an extension direction of the third channel 720.

The flame introduced into the discharge hole 711 may come into contact with the main blocking filter 731, and the main blocking filter 731 may block the flame from passing therethrough by absorbing the heat of the flame through heat exchange with the flame.

The gas introduced into the discharge hole 711 may pass through the mesh holes of the main blocking filter 731 and may be transmitted into the main canopy body 741.

The gas introduced into the main canopy body 741 may be finally discharged from the inside of the cabinet 100 through the main guide hole 742.

Figure 23:
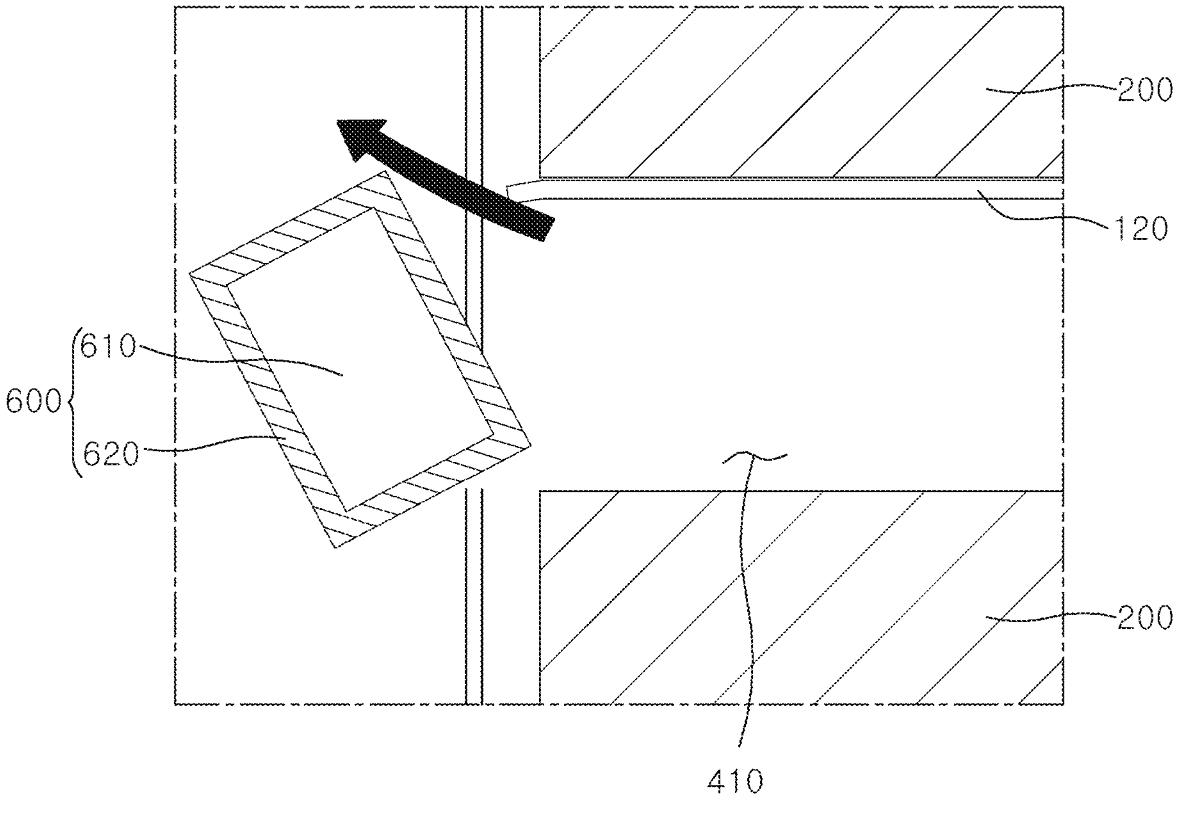

Referring to FIG. 23, when excessive pressure is formed with the first channel 400, the guide member 600 is separated from the first end portion 410 and the flame or gas introduced into the first channel 400 may be discharged toward the door 300 through the first end portion 410.

Thereafter, the same operation as described above with reference to FIGS. 8 and 9 may occur with respect to the flame or gas discharged to the outside of the first end portion 410.

Hereinafter, an energy storage system according to another embodiment of the present disclosure will be described.

The energy storage system according to the illustrated embodiment may differ from the energy storage system described above with reference to FIGS. 10 to 23 in the configuration of the guide member 600.

Accordingly, in describing the energy storage system according to the present embodiment, the configuration of the guide member 600 will be primarily described.

Figure 24:
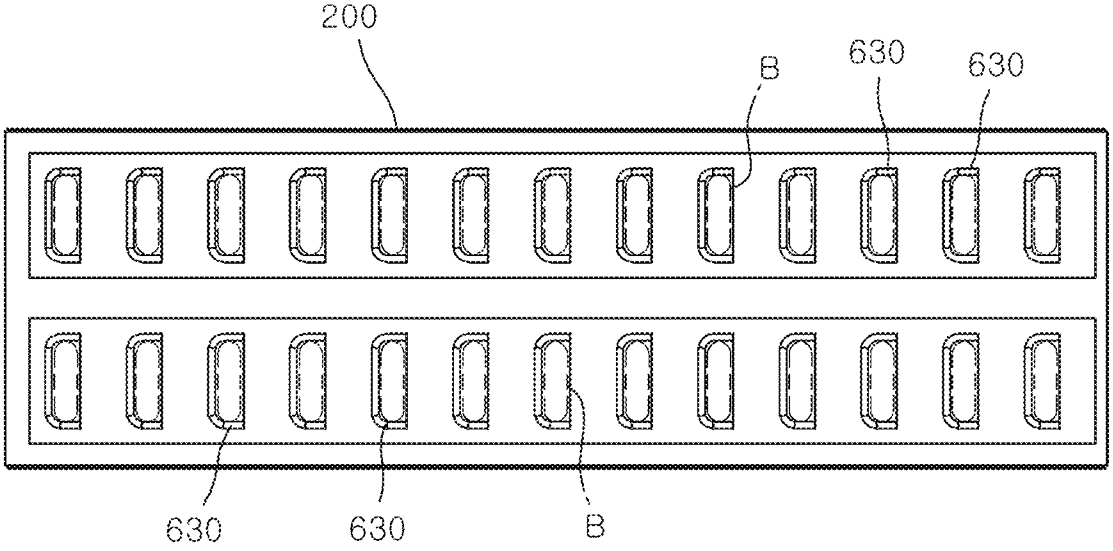
FIG. 24 is a plan view schematically illustrating an energy storage system according to another embodiment of the present disclosure.
Figure 25:
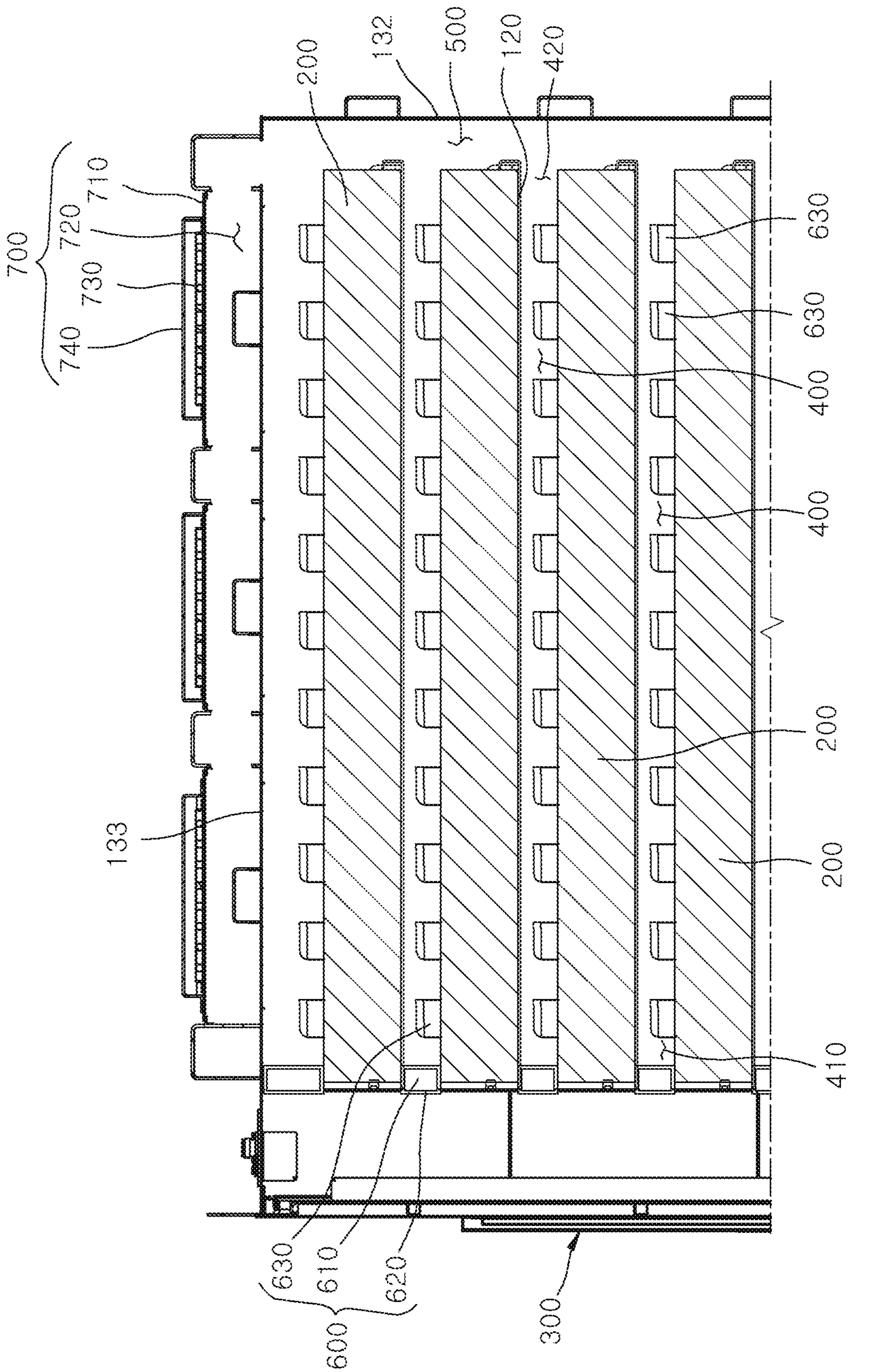
FIG. 25 is a cross-sectional view schematically illustrating the energy storage system shown in FIG. 24.
Figure 26:
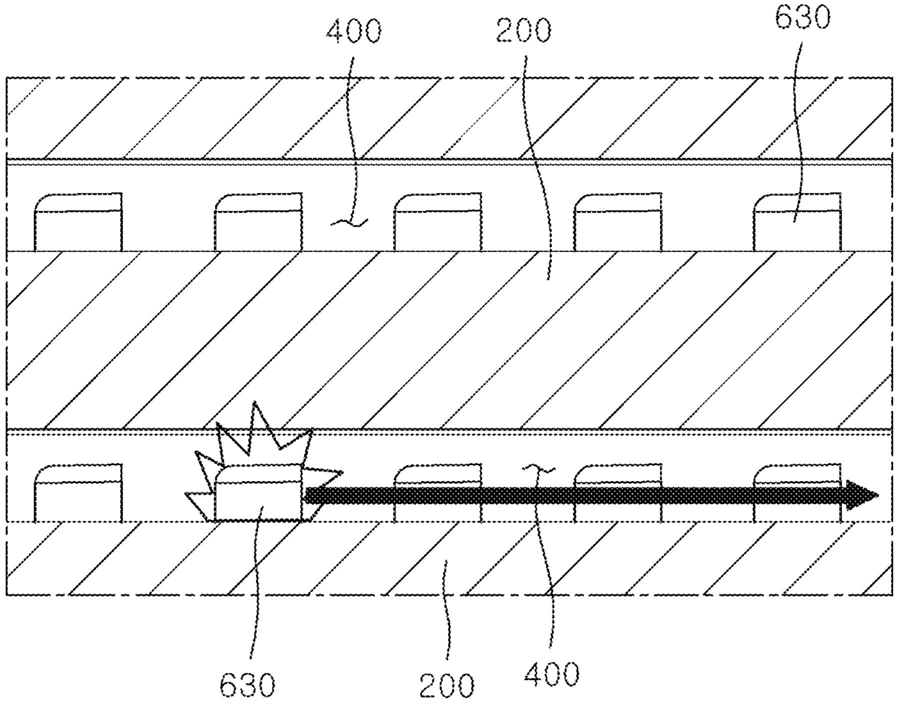
FIG. 26 is a schematic illustration of a state in which a flame or gas is discharged from a vent.

FIG. 24 is a plan view schematically illustrating the energy storage system according to another embodiment of the present disclosure, FIG. 25 is a cross-sectional view schematically illustrating the energy storage system shown in FIG. 24, and FIG. 26 is a view schematically illustrating a state in which a flame or gas is discharged from a vent.

Referring to FIGS. 24 to 26, the guide member 600, according to the illustrated embodiment, may further include a guide louver 630.

The guide louver 630 may be disposed inside the first channel 400. An inside of the guide louver 630 may be empty, and a lower surface of the guide louver 630 may be disposed to face the vent B of the battery module 200. The lower surface of the guide louver 630 may be open. Accordingly, the flame or gas discharged from the vent B may be introduced into the guide louver 630. A circumferential surface of the guide louver 630 facing the second end portion 420 may be open. Accordingly, the guide louver 630 may change the movement direction of the flame or gas discharged from the vent B toward the second end portion 420 to guide the flame or gas introduced into the first channel 400 to be transmitted to the second channel 500 more rapidly.

The guide louver 630 may be provided as a plurality of guide louvers 630. The plurality of guide louvers 630 may be individually disposed to face each vent B. The plurality of guide louvers 630 may be integrally connected through a plate or the like or may be separated from each other.

Hereinafter, an energy storage system according to another embodiment of the present disclosure will be described.

Figure 27:
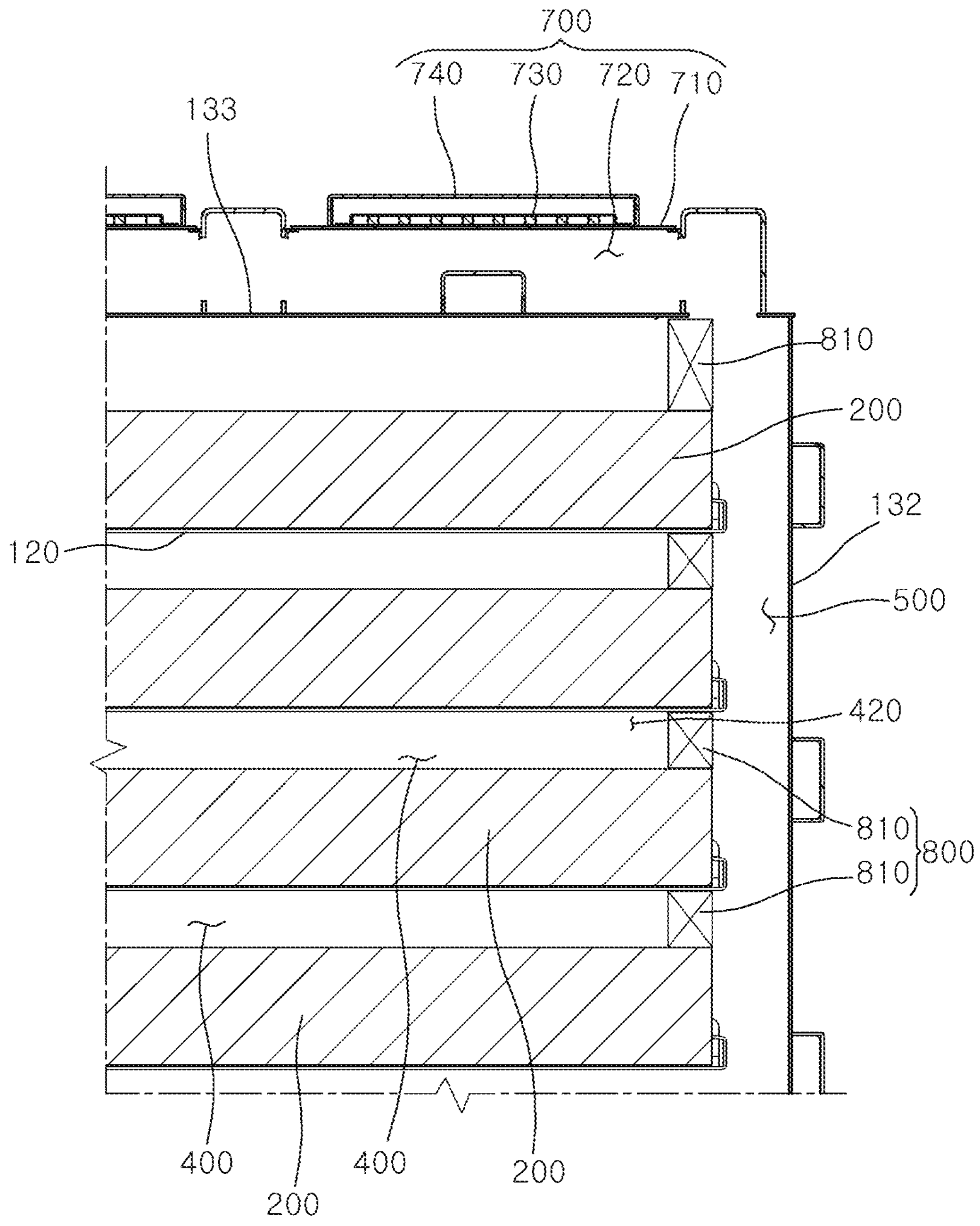
FIG. 27 is a cross-sectional view schematically illustrating an energy storage system according to another embodiment of the present disclosure.
Figure 28:
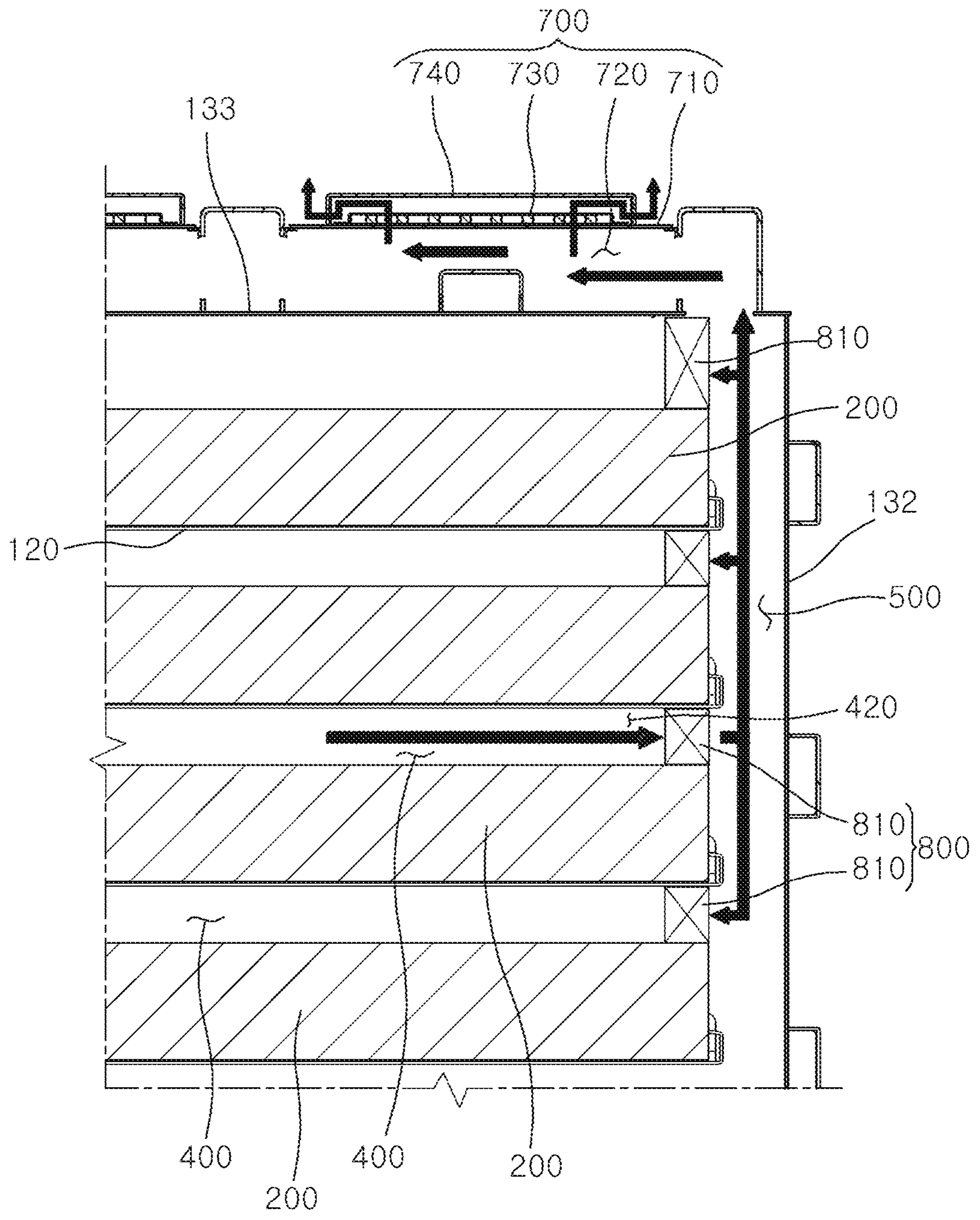
FIG. 28 is a schematic illustration of an operation of the energy storage system shown in FIG. 27.

FIG. 27 is a cross-sectional view schematically illustrating an energy storage system according to another embodiment of the present disclosure, and FIG. 28 is a view schematically illustrating an operation of the energy storage system shown in FIG. 27.

Referring to FIGS. 27 and 28, the energy storage system according to the illustrated embodiment may further include a backflow prevention member 800.

The energy storage system according to the present embodiment may differ from the energy storage system described above in that a backflow prevention member 800 is further included.

Accordingly, in describing the energy storage system according to the present embodiment, the backflow prevention member 800 will be primarily described.

The backflow prevention member 800 may be disposed between the first channel 400 and the second channel 500 and may block the flame or gas introduced into the second channel 500 from moving backwardly into the first channel 400. Accordingly, the backflow prevention member 800 may prevent damage to the battery module 200 that may occur when the flame or gas moves backwardly into the first channel 400 due to a sudden pressure drop in the second channel 500. Further, because the pressure of the first channel 400, in which no fire occurs, is lower than the pressure of the second channel 500, the backflow prevention member 800 can prevent the flame or gas transmitted to the second channel 500 from being introduced into the first channel 400 in which no fire occurs.

The backflow prevention member 800 may include a check valve 810.

The check valve 810 may be disposed inside the second end portion 420. Examples of the check valve 810 may include a pressure control valve that opens when the pressure of the first channel 400 exceeds the pressure of the second channel 500 and closes when the pressure of the first channel 400 is lower than the pressure of the second channel 500. The check valve 810 may be provided as a plurality of check valves 810. The plurality of check valves 810 may be individually installed in the second end portion 420 of the first channel 400.

According to embodiments of the present disclosure, the spread of fire due to the outflow of a flame may be prevented by allowing gas to be discharged to the outside of a cabinet while blocking a flame from being discharged to the outside of the cabinet.

According to embodiments of the present disclosure, a door is disposed to face a side surface of a battery module, and thus, the cooling efficiency of the battery module may be improved due to air introduced from the outside during normal operation of the battery module.

According to embodiments of the present disclosure, a guide hole is disposed to face upwardly or downwardly, and thus, gas discharged to the outside of a cabinet may be directed to move in a direction that prevents damage to adjacent parts or the like that are sensitive to contact with the gas.

According to embodiments of the present disclosure, damage caused by a fire may be reduced by allowing a flame or gas generated due to ignition or thermal runaway of a battery module to be moved through a set path.

According to embodiments of the present disclosure, a fire occurring in any one battery module may be prevented from spreading to adjacent battery modules or adjacent equipment installed outside the cabinet with a first partition and a second partition.

According to embodiments of the present disclosure, by changing a movement path for a flame multiple times, a transmission speed of the flame can be lowered and the flame blocking performance of a blocking member can be further improved.

However, aspects and features of the present disclosure are not limited to the above described above, and other aspects and features that are not mentioned will be clearly understood by those skilled in the art.

While the present disclosure has been described with reference to embodiments shown in the drawings, these embodiments are merely illustrative and it should be understood that various modifications and equivalent other embodiments can be derived by those skilled in the art on the basis of the embodiments.

Therefore, the technical scope of the present disclosure should be defined by the appended claims and their equivalents.

What is claimed is:

1. A door comprising:

a first door frame;

a second door frame facing the first door frame;

a door channel between the first door frame and the second door frame;

an inlet hole passing through the first door frame and configured to allow a flame or gas to be introduced into the door channel;

a discharge hole passing through the second door frame and configured to allow a flame or gas to be discharged from the door channel; and a blocking member outside the second door frame, facing the discharge hole, and configured to block a flame that is discharged from the discharge hole toward the outside from passing therethrough.

2. The door as claimed in claim 1, wherein the door channel has a first inlet end portion and a second inlet end portion spaced apart from each other, and wherein the inlet hole comprises:

a first inlet hole connected to the first inlet end portion; and a second inlet hole connected to the second inlet end portion.

3. The door as claimed in claim 2, wherein the first inlet end portion and the second inlet end portion are spaced apart from each other in a direction crossing a direction in which the inlet hole passes through the first door frame.

4. The door as claimed in claim 2, wherein the first inlet end portion and the second inlet end portion are spaced apart from each other in a direction parallel to the first door frame.

5. The door as claimed in claim 2, wherein the first inlet hole comprises:

a first upper inlet hole;

a first lower inlet hole below the first upper inlet hole; and a first intermediate inlet hole between the first upper inlet hole and the first lower inlet hole.

6. The door as claimed in claim 5, wherein the first upper inlet hole, the first lower inlet hole, and the first intermediate inlet hole are separated from each other.

7. The door as claimed in claim 2, wherein the second inlet hole comprises:

a second upper inlet hole;

a second lower inlet hole below the second upper inlet hole; and a second intermediate inlet hole between the second upper inlet hole and the second lower inlet hole.

8. The door as claimed in claim 7, wherein the second upper inlet hole, the second lower inlet hole, and the second intermediate inlet hole are separated from each other.

9. The door as claimed in claim 2, wherein the discharge hole is offset from the first inlet hole and the second inlet hole.

10. The door as claimed in claim 2, wherein the discharge hole is between the first inlet hole and the second inlet hole.

11. The door as claimed in claim 1, wherein a ratio of an area of the inlet hole to an area of the discharge hole is in a range between 50% and 80%.

12. The door as claimed in claim 1, wherein the blocking member comprises:

a blocking filter facing the discharge hole and having a plurality of mesh holes; and a fixing bracket configured to fix the blocking filter to the second door frame.

13. The door as claimed in claim 1, further comprising a canopy facing the blocking member and configured to guide discharge of gas that has passed through the blocking member.

14. The door as claimed in claim 13, wherein the canopy comprises:

a canopy body facing the blocking member and fixed to the second door frame; and a guide hole passing through the canopy body and connected to the discharge hole.

15. The door as claimed in claim 14, wherein the guide hole faces upwardly or downwardly.

16. The door as claimed in claim 14, wherein the guide hole comprises a pair of guide holes, one facing upwardly and the other facing downwardly.

17. An energy storage system comprising:

a cabinet;

a plurality of battery modules inside the cabinet; and a door configured to open or close an internal space in the cabinet, the door comprising:

a first door frame movably connected to the cabinet;

a second door frame facing the first door frame;

a door channel between the first door frame and the second door frame;

an inlet hole passing through the first door frame and configured to allow a flame or gas to be introduced into the door channel;

a discharge hole passing through the second door frame and configured to allow the flame or gas to be discharged from the door channel; and a blocking member outside the second door frame, facing the discharge hole, and configured to block a flame that is discharged from the discharge hole toward the outside from passing therethrough.

18. The energy storage system as claimed in claim 17, wherein the door faces side surfaces of the battery modules.

19. The energy storage system as claimed in claim 17, further comprising:

a first channel facing a vent of one of the battery modules and having a first end portion and a second end portion spaced apart from each other in a first direction;

a guide member in the first channel and configured to guide a flame or gas discharged from the vent in the first direction;

a second channel inside the cabinet and connected to the second end portion; and a discharge member connected to the second channel and configured to allow gas introduced into the second channel to be discharged outward from the cabinet.

20. The energy storage system as claimed in claim 19, wherein the door faces the first end portion.

* * * * *